(12) United States Patent
Har-Shai et al.

(10) Patent No.: US 9,876,466 B2
(45) Date of Patent: Jan. 23, 2018

(54) PHOTOVOLTAIC PANEL CIRCUITRY

(71) Applicant: Solaredge Technologies Ltd., Hod Hasharon (IL)

(72) Inventors: Liron Har-Shai, Haifa (IL); Alon Zohar, Netanya (IL); Ilan Yoscovitch, Ramat-Gan (IL); Yoav Galin, Ra'anana (IL); Lior Handelsman, Givataim (IL)

(73) Assignee: Solaredge Technologies Ltd., Herzeliya (IL)

( * ) Notice: Subject to any disclaimer, the term of this patent is extended or adjusted under 35 U.S.C. 154(b) by 0 days.

(21) Appl. No.: 14/631,227

(22) Filed: Feb. 25, 2015

(65) Prior Publication Data

US 2015/0171789 A1 Jun. 18, 2015

Related U.S. Application Data

(63) Continuation of application No. 13/753,041, filed on Jan. 29, 2013, now Pat. No. 8,988,838.

(30) Foreign Application Priority Data

Jan. 30, 2012 (GB) .................................. 1201506.1

(51) Int. Cl.
*H02S 40/36* (2014.01)
*G08B 13/14* (2006.01)
(Continued)

(52) U.S. Cl.
CPC .............. *H02S 40/36* (2014.12); *G08B 13/14* (2013.01); *H01L 31/02021* (2013.01);
(Continued)

(58) Field of Classification Search
CPC ........................... H02S 40/36; H01L 31/02021
See application file for complete search history.

(56) References Cited

U.S. PATENT DOCUMENTS

| 2,367,925 A | 1/1945 | Brown |
| 2,758,219 A | 8/1956 | Miller |

(Continued)

FOREIGN PATENT DOCUMENTS

| AU | 2073800 A | 9/2000 |
| AU | 2005262278 A1 | 1/2006 |

(Continued)

OTHER PUBLICATIONS

International Application No. PCT/US13/27965, International Preliminary Examination Report, Sep. 2, 2014.
(Continued)

*Primary Examiner* — Scott Bauer
(74) *Attorney, Agent, or Firm* — Banner & Witcoff, Ltd.

(57) ABSTRACT

Circuits integrated or integrable with a photovoltaic panel to provide built-in functionality to the photovoltaic panel including safety features such as arc detection and elimination, ground fault detection and elimination, reverse current protection, monitoring of the performance of the photovoltaic panel, transmission of the monitored parameters and theft prevention of the photovoltaic panel. The circuits may avoid power conversion, for instance DC/DC power conversion, may avoid performing maximum power tracking to include a minimum number of components and thereby increase overall reliability.

20 Claims, 8 Drawing Sheets

(51) Int. Cl.
*H02H 3/16* (2006.01)
*H02H 1/00* (2006.01)
*H01L 31/02* (2006.01)
*H02J 1/00* (2006.01)

(52) U.S. Cl.
CPC ............ *H02H 1/0015* (2013.01); *H02H 3/16* (2013.01); *H02J 1/00* (2013.01); *Y02E 10/50* (2013.01); *Y02E 10/56* (2013.01); *Y10T 307/625* (2015.04)

(56) References Cited

U.S. PATENT DOCUMENTS

| | | |
|---|---|---|
| 2,852,721 A | 9/1958 | Harders et al. |
| 3,369,210 A | 2/1968 | Manickella |
| 3,392,326 A | 7/1968 | Lamberton |
| 3,566,143 A | 2/1971 | Paine et al. |
| 3,596,229 A | 7/1971 | Hohorst |
| 3,696,286 A | 10/1972 | Ule |
| 3,740,652 A | 6/1973 | Burgener |
| 3,958,136 A | 5/1976 | Schroeder |
| 4,060,757 A | 11/1977 | McMurray |
| 4,101,816 A | 7/1978 | Shepter |
| 4,104,687 A | 8/1978 | Zulaski |
| 4,129,788 A | 12/1978 | Chavannes |
| 4,146,785 A | 3/1979 | Neale |
| 4,161,771 A | 7/1979 | Bates |
| 4,171,861 A | 10/1979 | Hohorst |
| 4,183,079 A | 1/1980 | Wachi |
| 4,257,087 A | 3/1981 | Cuk |
| 4,296,461 A | 10/1981 | Mallory et al. |
| 4,321,581 A | 3/1982 | Tappeiner et al. |
| 4,346,341 A | 8/1982 | Blackburn et al. |
| 4,367,557 A | 1/1983 | Stern et al. |
| 4,375,662 A | 3/1983 | Baker |
| 4,404,472 A | 9/1983 | Steigerwald |
| 4,412,142 A | 10/1983 | Ragonese et al. |
| 4,452,867 A | 6/1984 | Conforti |
| 4,453,207 A | 6/1984 | Paul |
| 4,460,232 A | 7/1984 | Sotolongo |
| 4,479,175 A | 10/1984 | Gille et al. |
| 4,481,654 A | 11/1984 | Daniels et al. |
| 4,488,136 A | 12/1984 | Hansen et al. |
| 4,545,997 A | 10/1985 | Wong et al. |
| 4,549,254 A | 10/1985 | Kissel |
| 4,554,502 A | 11/1985 | Rohatyn |
| 4,554,515 A | 11/1985 | Burson et al. |
| 4,580,090 A | 4/1986 | Bailey et al. |
| 4,591,965 A | 5/1986 | Dickerson |
| 4,598,330 A | 7/1986 | Woodworth |
| 4,602,322 A | 7/1986 | Merrick |
| 4,604,567 A | 8/1986 | Chetty |
| 4,623,753 A | 11/1986 | Feldman et al. |
| 4,626,983 A | 12/1986 | Harada et al. |
| 4,631,565 A | 12/1986 | Tihanyi |
| 4,637,677 A | 1/1987 | Barkus |
| 4,639,844 A | 1/1987 | Gallios et al. |
| 4,641,042 A | 2/1987 | Miyazawa |
| 4,641,079 A | 2/1987 | Kato et al. |
| 4,644,458 A | 2/1987 | Harafuji et al. |
| 4,649,334 A | 3/1987 | Nakajima |
| 4,652,770 A | 3/1987 | Kumano |
| 4,683,529 A | 7/1987 | Bucher, II |
| 4,685,040 A | 8/1987 | Steigerwald et al. |
| 4,686,617 A | 8/1987 | Colton |
| 4,706,181 A | 11/1987 | Mercer |
| 4,719,553 A | 1/1988 | Hinckley |
| 4,720,667 A | 1/1988 | Lee et al. |
| 4,720,668 A | 1/1988 | Lee et al. |
| 4,736,151 A | 4/1988 | Dishner |
| 4,772,994 A | 9/1988 | Harada et al. |
| 4,783,728 A | 11/1988 | Hoffman |
| 4,797,803 A | 1/1989 | Carroll |
| 4,819,121 A | 4/1989 | Saito et al. |
| RE33,057 E | 9/1989 | Clegg et al. |
| 4,864,213 A | 9/1989 | Kido |
| 4,868,379 A | 9/1989 | West |
| 4,873,480 A | 10/1989 | Lafferty |
| 4,888,063 A | 12/1989 | Powell |
| 4,888,702 A | 12/1989 | Gerken et al. |
| 4,899,269 A | 2/1990 | Rouzies |
| 4,903,851 A | 2/1990 | Slough |
| 4,906,859 A | 3/1990 | Kobayashi et al. |
| 4,910,518 A | 3/1990 | Kim et al. |
| 4,951,117 A | 8/1990 | Kasai |
| 4,978,870 A | 12/1990 | Chen et al. |
| 4,987,360 A | 1/1991 | Thompson |
| 5,001,415 A | 3/1991 | Watkinson |
| 5,027,051 A | 6/1991 | Lafferty |
| 5,027,059 A | 6/1991 | de Montgolfier et al. |
| 5,045,988 A | 9/1991 | Gritter et al. |
| 5,081,558 A | 1/1992 | Mahler |
| 5,138,422 A | 8/1992 | Fujii et al. |
| 5,144,222 A | 9/1992 | Herbert |
| 5,155,670 A | 10/1992 | Brian |
| 5,191,519 A | 3/1993 | Kawakami |
| 5,196,781 A | 3/1993 | Jamieson et al. |
| 5,237,194 A | 8/1993 | Takahashi |
| 5,268,832 A | 12/1993 | Kandatsu |
| 5,280,133 A | 1/1994 | Nath |
| 5,280,232 A | 1/1994 | Kohl et al. |
| 5,287,261 A | 2/1994 | Ehsani |
| 5,289,361 A | 2/1994 | Vinciarelli |
| 5,289,998 A | 3/1994 | Bingley et al. |
| 5,327,071 A | 7/1994 | Frederick et al. |
| 5,329,222 A | 7/1994 | Gyugyi et al. |
| 5,345,375 A | 9/1994 | Mohan |
| 5,379,209 A | 1/1995 | Goff |
| 5,381,327 A | 1/1995 | Yan |
| 5,391,235 A | 2/1995 | Inoue |
| 5,402,060 A | 3/1995 | Erisman |
| 5,404,059 A | 4/1995 | Loffler |
| 5,412,558 A | 5/1995 | Sakurai et al. |
| 5,413,313 A | 5/1995 | Mutterlein et al. |
| 5,446,645 A | 8/1995 | Shirahama et al. |
| 5,460,546 A | 10/1995 | Kunishi et al. |
| 5,493,154 A | 2/1996 | Smith et al. |
| 5,497,289 A | 3/1996 | Sugishima et al. |
| 5,504,418 A | 4/1996 | Ashley |
| 5,504,449 A | 4/1996 | Prentice |
| 5,517,378 A | 5/1996 | Asplund et al. |
| 5,530,335 A | 6/1996 | Decker et al. |
| 5,539,238 A | 7/1996 | Malhi |
| 5,548,504 A | 8/1996 | Takehara |
| 5,563,780 A | 10/1996 | Goad |
| 5,565,855 A | 10/1996 | Knibbe |
| 5,576,941 A | 11/1996 | Nguyen et al. |
| 5,585,749 A | 12/1996 | Pace et al. |
| 5,604,430 A | 2/1997 | Decker et al. |
| 5,616,913 A | 4/1997 | Litterst |
| 5,636,107 A | 6/1997 | Lu et al. |
| 5,644,219 A | 7/1997 | Kurokawa |
| 5,646,501 A | 7/1997 | Fishman et al. |
| 5,648,731 A | 7/1997 | Decker et al. |
| 5,659,465 A | 8/1997 | Flack et al. |
| 5,677,833 A | 10/1997 | Bingley |
| 5,684,385 A | 11/1997 | Guyonneau et al. |
| 5,686,766 A | 11/1997 | Tamechika |
| 5,703,390 A | 12/1997 | Itoh |
| 5,708,576 A | 1/1998 | Jones et al. |
| 5,719,758 A | 2/1998 | Nakata et al. |
| 5,722,057 A | 2/1998 | Wu |
| 5,726,505 A | 3/1998 | Yamada et al. |
| 5,726,615 A | 3/1998 | Bloom |
| 5,731,603 A | 3/1998 | Nakagawa et al. |
| 5,734,565 A | 3/1998 | Mueller et al. |
| 5,747,967 A | 5/1998 | Muljadi et al. |
| 5,773,963 A | 6/1998 | Blanc et al. |
| 5,777,515 A | 7/1998 | Kimura |
| 5,777,858 A | 7/1998 | Rodulfo |
| 5,780,092 A | 7/1998 | Agbo et al. |
| 5,793,184 A | 8/1998 | O'Connor |
| 5,798,631 A | 8/1998 | Spee et al. |
| 5,801,519 A | 9/1998 | Midya et al. |

(56) References Cited

U.S. PATENT DOCUMENTS

| | | |
|---|---|---|
| 5,804,894 A | 9/1998 | Leeson et al. |
| 5,812,045 A | 9/1998 | Ishikawa et al. |
| 5,814,970 A | 9/1998 | Schmidt |
| 5,821,734 A | 10/1998 | Faulk |
| 5,822,186 A | 10/1998 | Bull et al. |
| 5,838,148 A | 11/1998 | Kurokami et al. |
| 5,847,549 A | 12/1998 | Dodson, III |
| 5,859,772 A | 1/1999 | Hilpert |
| 5,869,956 A | 2/1999 | Nagao et al. |
| 5,873,738 A | 2/1999 | Shimada et al. |
| 5,886,882 A | 3/1999 | Rodulfo |
| 5,886,890 A | 3/1999 | Ishida et al. |
| 5,892,354 A | 4/1999 | Nagao et al. |
| 5,898,585 A | 4/1999 | Sirichote et al. |
| 5,903,138 A | 5/1999 | Hwang et al. |
| 5,905,645 A | 5/1999 | Cross |
| 5,917,722 A | 6/1999 | Singh |
| 5,919,314 A | 7/1999 | Kim |
| 5,923,100 A | 7/1999 | Lukens et al. |
| 5,923,158 A | 7/1999 | Kurokami et al. |
| 5,929,614 A | 7/1999 | Copple |
| 5,930,128 A | 7/1999 | Dent |
| 5,930,131 A | 7/1999 | Feng |
| 5,932,994 A | 8/1999 | Jo et al. |
| 5,933,327 A | 8/1999 | Leighton et al. |
| 5,945,806 A | 8/1999 | Faulk |
| 5,946,206 A | 8/1999 | Shimizu et al. |
| 5,949,668 A | 9/1999 | Schweighofer |
| 5,961,739 A | 10/1999 | Osborne |
| 5,963,010 A | 10/1999 | Hayashi et al. |
| 5,963,078 A | 10/1999 | Wallace |
| 5,982,253 A | 11/1999 | Perrin et al. |
| 5,990,659 A | 11/1999 | Frannhagen |
| 6,002,290 A | 12/1999 | Avery et al. |
| 6,021,052 A | 2/2000 | Unger et al. |
| 6,031,736 A | 2/2000 | Takehara et al. |
| 6,037,720 A | 3/2000 | Wong et al. |
| 6,038,148 A | 3/2000 | Farrington et al. |
| 6,046,470 A | 4/2000 | Williams et al. |
| 6,046,919 A | 4/2000 | Madenokouji et al. |
| 6,050,779 A | 4/2000 | Nagao et al. |
| 6,058,035 A | 5/2000 | Madenokouji et al. |
| 6,064,086 A | 5/2000 | Nakagawa et al. |
| 6,078,511 A | 6/2000 | Fasullo et al. |
| 6,081,104 A | 6/2000 | Kern |
| 6,082,122 A | 7/2000 | Madenokouji et al. |
| 6,087,738 A | 7/2000 | Hammond |
| 6,093,885 A | 7/2000 | Takehara et al. |
| 6,094,129 A | 7/2000 | Baiatu |
| 6,101,073 A | 8/2000 | Takehara |
| 6,105,317 A | 8/2000 | Tomiuchi et al. |
| 6,111,188 A | 8/2000 | Kurokami et al. |
| 6,111,391 A | 8/2000 | Cullen |
| 6,111,767 A | 8/2000 | Handleman |
| 6,130,458 A | 10/2000 | Takagi et al. |
| 6,150,739 A | 11/2000 | Baumgartl et al. |
| 6,151,234 A | 11/2000 | Oldenkamp |
| 6,163,086 A | 12/2000 | Choo |
| 6,166,455 A | 12/2000 | Li |
| 6,166,527 A | 12/2000 | Dwelley et al. |
| 6,169,678 B1 | 1/2001 | Kondo et al. |
| 6,175,219 B1 | 1/2001 | Imamura et al. |
| 6,175,512 B1 | 1/2001 | Hagihara et al. |
| 6,191,456 B1 | 2/2001 | Stoisiek et al. |
| 6,219,623 B1 | 4/2001 | Wills |
| 6,225,793 B1 | 5/2001 | Dickmann |
| 6,255,360 B1 | 7/2001 | Domschke et al. |
| 6,255,804 B1 | 7/2001 | Herniter et al. |
| 6,256,234 B1 | 7/2001 | Keeth et al. |
| 6,259,234 B1 | 7/2001 | Perol |
| 6,262,558 B1 | 7/2001 | Weinberg |
| 6,268,559 B1 | 7/2001 | Yamawaki |
| 6,274,804 B1 | 8/2001 | Psyk et al. |
| 6,281,485 B1 | 8/2001 | Siri |
| 6,285,572 B1 | 9/2001 | Onizuka et al. |
| 6,292,379 B1 | 9/2001 | Edevold et al. |
| 6,301,128 B1 | 10/2001 | Jang et al. |
| 6,304,065 B1 | 10/2001 | Wittenbreder |
| 6,307,749 B1 | 10/2001 | Daanen et al. |
| 6,311,137 B1 | 10/2001 | Kurokami et al. |
| 6,316,716 B1 | 11/2001 | Hilgrath |
| 6,320,769 B2 | 11/2001 | Kurokami et al. |
| 6,331,670 B2 | 12/2001 | Takehara et al. |
| 6,339,538 B1 | 1/2002 | Handleman |
| 6,344,612 B1 | 2/2002 | Kuwahara et al. |
| 6,346,451 B1 | 2/2002 | Simpson et al. |
| 6,350,944 B1 | 2/2002 | Sherif et al. |
| 6,351,130 B1 | 2/2002 | Preiser et al. |
| 6,369,461 B1 | 4/2002 | Jungreis et al. |
| 6,369,462 B1 | 4/2002 | Siri |
| 6,380,719 B2 | 4/2002 | Underwood et al. |
| 6,396,170 B1 | 5/2002 | Laufenberg et al. |
| 6,396,239 B1 | 5/2002 | Benn et al. |
| 6,425,248 B1 | 7/2002 | Tonomura et al. |
| 6,429,546 B1 | 8/2002 | Ropp et al. |
| 6,429,621 B1 | 8/2002 | Arai |
| 6,433,522 B1 | 8/2002 | Siri |
| 6,433,978 B1 | 8/2002 | Neiger et al. |
| 6,441,597 B1 | 8/2002 | Lethellier |
| 6,445,599 B1 | 9/2002 | Nguyen |
| 6,448,489 B2 | 9/2002 | Kimura et al. |
| 6,452,814 B1 | 9/2002 | Wittenbreder |
| 6,469,919 B1 | 10/2002 | Bennett |
| 6,472,254 B2 | 10/2002 | Cantarini et al. |
| 6,483,203 B1 | 11/2002 | McCormack |
| 6,493,246 B2 | 12/2002 | Suzui et al. |
| 6,501,362 B1 | 12/2002 | Hoffman et al. |
| 6,507,176 B2 | 1/2003 | Wittenbreder, Jr. |
| 6,509,712 B1 | 1/2003 | Landis |
| 6,515,215 B1 | 2/2003 | Mimura |
| 6,519,165 B2 | 2/2003 | Koike |
| 6,528,977 B2 | 3/2003 | Arakawa |
| 6,531,848 B1 | 3/2003 | Chitsazan et al. |
| 6,545,211 B1 | 4/2003 | Mimura |
| 6,548,205 B2 | 4/2003 | Leung et al. |
| 6,560,131 B1 | 5/2003 | vonBrethorst |
| 6,587,051 B2 | 7/2003 | Takehara et al. |
| 6,590,793 B1 | 7/2003 | Nagao et al. |
| 6,590,794 B1 | 7/2003 | Carter |
| 6,593,520 B2 | 7/2003 | Kondo et al. |
| 6,593,521 B2 | 7/2003 | Kobayashi |
| 6,600,100 B2 | 7/2003 | Ho et al. |
| 6,603,672 B1 | 8/2003 | Deng et al. |
| 6,608,468 B2 | 8/2003 | Nagase |
| 6,611,130 B2 | 8/2003 | Chang |
| 6,611,441 B2 | 8/2003 | Kurokami et al. |
| 6,628,011 B2 | 9/2003 | Droppo et al. |
| 6,633,824 B2 | 10/2003 | Dollar, II |
| 6,650,031 B1 * | 11/2003 | Goldack ............ G08B 13/1418 307/149 |
| 6,650,560 B2 | 11/2003 | MacDonald et al. |
| 6,653,549 B2 | 11/2003 | Matsushita et al. |
| 6,655,987 B2 | 12/2003 | Higashikozono et al. |
| 6,657,419 B2 | 12/2003 | Renyolds |
| 6,672,018 B2 | 1/2004 | Shingleton |
| 6,678,174 B2 | 1/2004 | Suzui et al. |
| 6,690,590 B2 | 2/2004 | Stamenic et al. |
| 6,693,327 B2 | 2/2004 | Priefert et al. |
| 6,693,781 B1 | 2/2004 | Kroker |
| 6,709,291 B1 | 3/2004 | Wallace et al. |
| 6,731,136 B2 | 5/2004 | Knee |
| 6,738,692 B2 | 5/2004 | Schienbein et al. |
| 6,744,643 B2 | 6/2004 | Luo et al. |
| 6,750,391 B2 | 6/2004 | Bower et al. |
| 6,765,315 B2 | 7/2004 | Hammerstrom et al. |
| 6,768,047 B2 | 7/2004 | Chang et al. |
| 6,768,180 B2 | 7/2004 | Salama et al. |
| 6,788,033 B2 | 9/2004 | Vinciarelli |
| 6,788,146 B2 | 9/2004 | Forejt et al. |
| 6,795,318 B2 | 9/2004 | Haas et al. |
| 6,800,964 B2 | 10/2004 | Beck |
| 6,801,442 B2 | 10/2004 | Suzui et al. |
| 6,807,069 B2 | 10/2004 | Nieminen et al. |
| 6,809,942 B2 | 10/2004 | Madenokouji et al. |

(56) References Cited

U.S. PATENT DOCUMENTS

| | | |
|---|---|---|
| 6,810,339 B2 | 10/2004 | Wills |
| 6,812,396 B2 | 11/2004 | Makita et al. |
| 6,828,503 B2 | 12/2004 | Yoshikawa et al. |
| 6,837,739 B2 | 1/2005 | Gorringe et al. |
| 6,838,611 B2 | 1/2005 | Kondo et al. |
| 6,842,354 B1 | 1/2005 | Tallam et al. |
| 6,850,074 B2 | 2/2005 | Adams et al. |
| 6,856,102 B1 | 2/2005 | Lin et al. |
| 6,882,131 B1 | 4/2005 | Takada et al. |
| 6,888,728 B2 | 5/2005 | Takagi et al. |
| 6,914,418 B2 | 7/2005 | Sung |
| 6,919,714 B2 | 7/2005 | Delepaut |
| 6,927,955 B2 | 8/2005 | Suzui et al. |
| 6,933,627 B2 | 8/2005 | Wilhelm |
| 6,933,714 B2 | 8/2005 | Fasshauer et al. |
| 6,936,995 B2 | 8/2005 | Kapsokavathis et al. |
| 6,940,735 B2 | 9/2005 | Deng et al. |
| 6,949,843 B2 | 9/2005 | Dubovsky |
| 6,950,323 B2 | 9/2005 | Achleitner et al. |
| 6,963,147 B2 | 11/2005 | Kurokami et al. |
| 6,966,184 B2 | 11/2005 | Toyomura et al. |
| 6,980,783 B2 | 12/2005 | Liu et al. |
| 6,984,967 B2 | 1/2006 | Notman |
| 6,984,970 B2 | 1/2006 | Capel |
| 6,996,741 B1 | 2/2006 | Pittelkow et al. |
| 7,030,597 B2 | 4/2006 | Bruno et al. |
| 7,031,176 B2 | 4/2006 | Kotsopoulos et al. |
| 7,038,430 B2 | 5/2006 | Itabashi et al. |
| 7,042,195 B2 | 5/2006 | Tsunetsugu et al. |
| 7,045,991 B2 | 5/2006 | Nakamura et al. |
| 7,046,531 B2 | 5/2006 | Zocchi et al. |
| 7,053,506 B2 | 5/2006 | Alonso et al. |
| 7,061,211 B2 | 6/2006 | Satoh et al. |
| 7,061,214 B2 | 6/2006 | Mayega et al. |
| 7,064,967 B2 | 6/2006 | Ichinose et al. |
| 7,068,017 B2 | 6/2006 | Willner et al. |
| 7,072,194 B2 | 7/2006 | Nayar et al. |
| 7,078,883 B2 | 7/2006 | Chapman et al. |
| 7,079,406 B2 | 7/2006 | Kurokami et al. |
| 7,087,332 B2 | 8/2006 | Harris |
| 7,090,509 B1 | 8/2006 | Gilliland et al. |
| 7,091,707 B2 | 8/2006 | Cutler |
| 7,097,516 B2 | 8/2006 | Werner et al. |
| 7,099,169 B2 | 8/2006 | West et al. |
| 7,126,053 B2 | 10/2006 | Kurokami et al. |
| 7,126,294 B2 | 10/2006 | Minami et al. |
| 7,138,786 B2 | 11/2006 | Ishigaki et al. |
| 7,142,997 B1 | 11/2006 | Widner |
| 7,148,669 B2 | 12/2006 | Maksimovic et al. |
| 7,158,359 B2 | 1/2007 | Bertele et al. |
| 7,158,395 B2 | 1/2007 | Deng et al. |
| 7,161,082 B2 | 1/2007 | Matsushita et al. |
| 7,174,973 B1 | 2/2007 | Lysaght |
| 7,183,667 B2 | 2/2007 | Colby et al. |
| 7,193,872 B2 | 3/2007 | Siri |
| 7,202,653 B2 | 4/2007 | Pai |
| 7,218,541 B2 | 5/2007 | Price et al. |
| 7,248,946 B2 | 7/2007 | Bashaw et al. |
| 7,256,566 B2 | 8/2007 | Bhavaraju et al. |
| 7,259,474 B2 | 8/2007 | Blanc |
| 7,262,979 B2 | 8/2007 | Wai et al. |
| 7,276,886 B2 | 10/2007 | Kinder et al. |
| 7,277,304 B2 | 10/2007 | Stancu et al. |
| 7,281,141 B2 | 10/2007 | Elkayam et al. |
| 7,282,814 B2 | 10/2007 | Jacobs |
| 7,291,036 B1 | 11/2007 | Daily et al. |
| RE39,976 E | 1/2008 | Schiff et al. |
| 7,315,052 B2 | 1/2008 | Alter |
| 7,319,313 B2 | 1/2008 | Dickerson et al. |
| 7,324,361 B2 | 1/2008 | Siri |
| 7,336,004 B2 | 2/2008 | Lai |
| 7,336,056 B1 | 2/2008 | Dening |
| 7,339,287 B2 | 3/2008 | Jepsen et al. |
| 7,348,802 B2 | 3/2008 | Kasanyal et al. |
| 7,352,154 B2 | 4/2008 | Cook |
| 7,361,952 B2 | 4/2008 | Miura et al. |
| 7,371,963 B2 | 5/2008 | Suenaga et al. |
| 7,372,712 B2 | 5/2008 | Stancu et al. |
| 7,385,380 B2 | 6/2008 | Ishigaki et al. |
| 7,385,833 B2 | 6/2008 | Keung |
| 7,388,348 B2 | 6/2008 | Mattichak |
| 7,394,237 B2 | 7/2008 | Chou et al. |
| 7,405,117 B2 | 7/2008 | Zuniga et al. |
| 7,414,870 B2 | 8/2008 | Rottger et al. |
| 7,420,354 B2 | 9/2008 | Cutler |
| 7,420,815 B2 | 9/2008 | Love |
| 7,432,691 B2 | 10/2008 | Cutler |
| 7,435,134 B2 | 10/2008 | Lenox |
| 7,435,897 B2 | 10/2008 | Russell |
| 7,443,052 B2 | 10/2008 | Wendt et al. |
| 7,443,152 B2 | 10/2008 | Utsunomiya |
| 7,450,401 B2 | 11/2008 | Iida |
| 7,456,523 B2 | 11/2008 | Kobayashi |
| 7,463,500 B2 | 12/2008 | West |
| 7,466,566 B2 | 12/2008 | Fukumoto |
| 7,471,014 B2 | 12/2008 | Lum et al. |
| 7,471,524 B1 | 12/2008 | Batarseh et al. |
| 7,479,774 B2 | 1/2009 | Wai et al. |
| 7,482,238 B2 | 1/2009 | Sung |
| 7,495,419 B1 | 2/2009 | Ju |
| 7,504,811 B2 | 3/2009 | Watanabe et al. |
| 7,518,346 B2 | 4/2009 | Prexl et al. |
| 7,538,451 B2 | 5/2009 | Nomoto |
| 7,560,915 B2 | 7/2009 | Ito et al. |
| 7,589,437 B2 | 9/2009 | Henne et al. |
| 7,595,616 B2 | 9/2009 | Prexl et al. |
| 7,596,008 B2 | 9/2009 | Iwata et al. |
| 7,599,200 B2 | 10/2009 | Tomonaga |
| 7,600,349 B2 | 10/2009 | Liebendorfer |
| 7,602,080 B1 | 10/2009 | Hadar et al. |
| 7,605,498 B2 | 10/2009 | Ledenev et al. |
| 7,612,283 B2 | 11/2009 | Toyomura et al. |
| 7,615,981 B2 | 11/2009 | Wong et al. |
| 7,626,834 B2 | 12/2009 | Chisenga et al. |
| 7,646,116 B2 | 1/2010 | Batarseh et al. |
| 7,649,434 B2 | 1/2010 | Xu et al. |
| 7,701,083 B2 | 4/2010 | Savage |
| 7,709,727 B2 | 5/2010 | Roehrig et al. |
| 7,719,140 B2 | 5/2010 | Ledenev et al. |
| 7,723,865 B2 | 5/2010 | Kitanaka |
| 7,733,069 B2 | 6/2010 | Toyomura et al. |
| 7,748,175 B2 | 7/2010 | Liebendorfer |
| 7,759,575 B2 | 7/2010 | Jones et al. |
| 7,763,807 B2 | 7/2010 | Richter |
| 7,772,716 B2 | 8/2010 | Shaver, II et al. |
| 7,780,472 B2 | 8/2010 | Lenox |
| 7,782,031 B2 | 8/2010 | Qiu et al. |
| 7,783,389 B2 | 8/2010 | Yamada et al. |
| 7,787,273 B2 | 8/2010 | Lu et al. |
| 7,804,282 B2 | 9/2010 | Bertele |
| 7,807,919 B2 | 10/2010 | Powell et al. |
| 7,808,125 B1 | 10/2010 | Sachdeva et al. |
| 7,812,592 B2 | 10/2010 | Prior et al. |
| 7,812,701 B2 | 10/2010 | Lee et al. |
| 7,821,225 B2 | 10/2010 | Chou et al. |
| 7,824,189 B1 | 11/2010 | Lauermann et al. |
| 7,839,022 B2 | 11/2010 | Wolfs |
| 7,843,085 B2 | 11/2010 | Ledenev et al. |
| 7,864,497 B2 | 1/2011 | Quardt et al. |
| 7,868,599 B2 | 1/2011 | Rahman et al. |
| 7,880,334 B2 | 2/2011 | Evans et al. |
| 7,883,808 B2 | 2/2011 | Norimatsu et al. |
| 7,884,278 B2 | 2/2011 | Powell et al. |
| 7,893,346 B2 | 2/2011 | Nachamkin et al. |
| 7,898,112 B2 | 3/2011 | Powell et al. |
| 7,900,361 B2 | 3/2011 | Adest et al. |
| 7,906,870 B2 | 3/2011 | Ohm |
| 7,919,952 B1 | 4/2011 | Fahrenbruch |
| 7,919,953 B2 | 4/2011 | Porter et al. |
| 7,925,552 B2 | 4/2011 | Tarbell et al. |
| 7,944,191 B2 | 5/2011 | Xu |
| 7,945,413 B2 | 5/2011 | Krein |
| 7,948,221 B2 | 5/2011 | Watanabe et al. |
| 7,952,897 B2 | 5/2011 | Nocentini et al. |

(56) References Cited

U.S. PATENT DOCUMENTS

| | | |
|---|---|---|
| 7,960,650 B2 | 6/2011 | Richter et al. |
| 7,960,950 B2 | 6/2011 | Glovinsky |
| 7,969,133 B2 | 6/2011 | Zhang et al. |
| 8,003,885 B2 | 8/2011 | Richter et al. |
| 8,004,113 B2 | 8/2011 | Sander et al. |
| 8,004,116 B2 | 8/2011 | Ledenev et al. |
| 8,004,117 B2 | 8/2011 | Adest et al. |
| 8,004,866 B2 | 8/2011 | Bucella et al. |
| 8,013,472 B2 | 9/2011 | Adest et al. |
| 8,018,748 B2 | 9/2011 | Leonard |
| 8,035,249 B2 | 10/2011 | Shaver, II et al. |
| 8,039,730 B2 | 10/2011 | Hadar et al. |
| 8,058,747 B2 | 11/2011 | Avrutsky et al. |
| 8,058,752 B2 | 11/2011 | Erickson, Jr. et al. |
| 8,067,855 B2 | 11/2011 | Mumtaz et al. |
| 8,077,437 B2 | 12/2011 | Mumtaz et al. |
| 8,089,780 B2 | 1/2012 | Mochikawa et al. |
| 8,089,785 B2 | 1/2012 | Rodriguez |
| 8,090,548 B2 | 1/2012 | Abdennadher et al. |
| 8,093,756 B2 | 1/2012 | Porter et al. |
| 8,093,757 B2 | 1/2012 | Wolfs |
| 8,097,818 B2 | 1/2012 | Gerull et al. |
| 8,098,055 B2 | 1/2012 | Avrutsky et al. |
| 8,102,074 B2 | 1/2012 | Hadar et al. |
| 8,102,144 B2 | 1/2012 | Capp et al. |
| 8,111,052 B2 | 2/2012 | Glovinsky |
| 8,116,103 B2 | 2/2012 | Zacharias et al. |
| 8,138,631 B2 | 3/2012 | Allen et al. |
| 8,138,914 B2 | 3/2012 | Wong et al. |
| 8,139,335 B2 | 3/2012 | Quardt et al. |
| 8,139,382 B2 | 3/2012 | Zhang et al. |
| 8,148,849 B2 | 4/2012 | Zanarini et al. |
| 8,158,877 B2 | 4/2012 | Klein et al. |
| 8,169,252 B2 | 5/2012 | Fahrenbruch et al. |
| 8,179,147 B2 | 5/2012 | Dargatz et al. |
| 8,184,460 B2 | 5/2012 | O'Brien et al. |
| 8,204,709 B2 | 6/2012 | Presher, Jr. et al. |
| 8,212,408 B2 | 7/2012 | Fishman |
| 8,212,409 B2 | 7/2012 | Bettenwort et al. |
| 8,248,804 B2 | 8/2012 | Han et al. |
| 8,271,599 B2 | 9/2012 | Eizips et al. |
| 8,274,172 B2 | 9/2012 | Hadar et al. |
| 8,279,644 B2 | 10/2012 | Zhang et al. |
| 8,289,183 B1 | 10/2012 | Foss |
| 8,289,742 B2 | 10/2012 | Adest et al. |
| 8,294,451 B2 | 10/2012 | Hasenfus |
| 8,304,932 B2 | 11/2012 | Ledenev et al. |
| 8,310,101 B2 | 11/2012 | Amaratunga et al. |
| 8,314,375 B2 | 11/2012 | Arditi et al. |
| 8,324,921 B2 | 12/2012 | Adest et al. |
| 8,325,059 B2 | 12/2012 | Rozenboim |
| 8,369,113 B2 | 2/2013 | Rodriguez |
| 8,378,656 B2 | 2/2013 | de Rooij et al. |
| 8,379,418 B2 * | 2/2013 | Falk ............. H02M 1/36 323/906 |
| 8,405,248 B2 | 3/2013 | Mumtaz et al. |
| 8,405,349 B2 | 3/2013 | Kikinis et al. |
| 8,405,367 B2 | 3/2013 | Chisenga et al. |
| 8,410,359 B2 | 4/2013 | Richter |
| 8,415,552 B2 | 4/2013 | Hadar et al. |
| 8,415,937 B2 | 4/2013 | Hester |
| 8,427,009 B2 | 4/2013 | Shaver, II et al. |
| 8,436,592 B2 | 5/2013 | Saitoh |
| 8,461,809 B2 | 6/2013 | Rodriguez |
| 8,466,789 B2 | 6/2013 | Muhlberger et al. |
| 8,473,250 B2 | 6/2013 | Adest et al. |
| 8,509,032 B2 | 8/2013 | Rakib |
| 8,531,055 B2 | 9/2013 | Adest et al. |
| 8,570,017 B2 | 10/2013 | Perichon et al. |
| 8,581,441 B2 | 11/2013 | Rotzoll et al. |
| 8,618,692 B2 | 12/2013 | Adest et al. |
| 8,653,689 B2 | 2/2014 | Rozenboim |
| 8,669,675 B2 | 3/2014 | Capp et al. |
| 8,670,255 B2 | 3/2014 | Gong et al. |
| 8,686,333 B2 | 4/2014 | Arditi et al. |
| 8,710,351 B2 | 4/2014 | Robbins |
| 8,751,053 B2 | 6/2014 | Hadar et al. |
| 8,773,236 B2 | 7/2014 | Makhota et al. |
| 8,791,598 B2 | 7/2014 | Jain |
| 8,809,699 B2 | 8/2014 | Funk |
| 8,811,047 B2 | 8/2014 | Rodriguez |
| 8,816,535 B2 | 8/2014 | Adest et al. |
| 8,823,218 B2 | 9/2014 | Hadar et al. |
| 8,835,748 B2 | 9/2014 | Frolov et al. |
| 8,841,916 B2 | 9/2014 | Avrutsky |
| 8,853,886 B2 | 10/2014 | Avrutsky et al. |
| 8,854,193 B2 | 10/2014 | Makhota et al. |
| 8,860,241 B2 | 10/2014 | Hadar et al. |
| 8,860,246 B2 | 10/2014 | Hadar et al. |
| 8,878,563 B2 | 11/2014 | Robbins |
| 8,922,061 B2 | 12/2014 | Arditi |
| 8,933,321 B2 | 1/2015 | Hadar et al. |
| 8,963,375 B2 | 2/2015 | DeGraaff |
| 8,963,378 B1 | 2/2015 | Fornage et al. |
| 9,291,696 B2 | 3/2016 | Adest et al. |
| 2001/0023703 A1 | 9/2001 | Kondo et al. |
| 2001/0032664 A1 | 10/2001 | Takehara et al. |
| 2001/0034982 A1 | 11/2001 | Nagao et al. |
| 2001/0035180 A1 | 11/2001 | Kimura et al. |
| 2001/0048605 A1 | 12/2001 | Kurokami et al. |
| 2001/0050102 A1 | 12/2001 | Matsumi et al. |
| 2001/0054881 A1 | 12/2001 | Watanabe |
| 2002/0014262 A1 | 2/2002 | Matsushita et al. |
| 2002/0034083 A1 | 3/2002 | Ayyanar et al. |
| 2002/0038667 A1 | 4/2002 | Kondo et al. |
| 2002/0041505 A1 | 4/2002 | Suzui et al. |
| 2002/0044473 A1 | 4/2002 | Toyomura et al. |
| 2002/0047309 A1 | 4/2002 | Droppo et al. |
| 2002/0056089 A1 | 5/2002 | Houston |
| 2002/0063552 A1 | 5/2002 | Arakawa |
| 2002/0078991 A1 | 6/2002 | Nagao et al. |
| 2002/0080027 A1 | 6/2002 | Conley |
| 2002/0118559 A1 | 8/2002 | Kurokami et al. |
| 2002/0149950 A1 | 10/2002 | Takebayashi |
| 2002/0165458 A1 | 11/2002 | Carter et al. |
| 2002/0177401 A1 | 11/2002 | Judd et al. |
| 2002/0179140 A1 | 12/2002 | Toyomura |
| 2002/0180408 A1 | 12/2002 | McDaniel et al. |
| 2003/0038615 A1 | 2/2003 | Elbanhawy |
| 2003/0058593 A1 | 3/2003 | Bertele et al. |
| 2003/0058662 A1 | 3/2003 | Baudelot et al. |
| 2003/0066076 A1 | 4/2003 | Minahan |
| 2003/0066555 A1 | 4/2003 | Hui et al. |
| 2003/0075211 A1 | 4/2003 | Makita et al. |
| 2003/0080741 A1 | 5/2003 | LeRow et al. |
| 2003/0085621 A1 | 5/2003 | Potega |
| 2003/0090233 A1 | 5/2003 | Browe |
| 2003/0094931 A1 | 5/2003 | Renyolds |
| 2003/0111103 A1 | 6/2003 | Bower et al. |
| 2003/0156439 A1 | 8/2003 | Ohmichi et al. |
| 2003/0164695 A1 | 9/2003 | Fasshauer et al. |
| 2003/0185026 A1 | 10/2003 | Matsuda et al. |
| 2003/0193821 A1 | 10/2003 | Krieger et al. |
| 2003/0201674 A1 | 10/2003 | Droppo et al. |
| 2003/0214274 A1 | 11/2003 | Lethellier |
| 2003/0223257 A1 | 12/2003 | Onoe |
| 2004/0004402 A1 | 1/2004 | Kippley |
| 2004/0041548 A1 | 3/2004 | Perry |
| 2004/0056768 A1 | 3/2004 | Matsushita et al. |
| 2004/0061527 A1 | 4/2004 | Knee |
| 2004/0076028 A1 | 4/2004 | Achleitner et al. |
| 2004/0117676 A1 | 6/2004 | Kobayashi et al. |
| 2004/0118446 A1 | 6/2004 | Toyomura |
| 2004/0123894 A1 | 7/2004 | Erban |
| 2004/0124816 A1 | 7/2004 | DeLepaut |
| 2004/0125618 A1 | 7/2004 | De Rooij et al. |
| 2004/0140719 A1 | 7/2004 | Vulih et al. |
| 2004/0141345 A1 | 7/2004 | Cheng et al. |
| 2004/0164718 A1 | 8/2004 | McDaniel et al. |
| 2004/0165408 A1 | 8/2004 | West et al. |
| 2004/0169499 A1 | 9/2004 | Huang et al. |
| 2004/0170038 A1 | 9/2004 | Ichinose et al. |
| 2004/0189090 A1 | 9/2004 | Yanagida et al. |
| 2004/0189432 A1 | 9/2004 | Yan et al. |

(56) References Cited

U.S. PATENT DOCUMENTS

| | | |
|---|---|---|
| 2004/0201279 A1 | 10/2004 | Templeton |
| 2004/0201933 A1 | 10/2004 | Blanc |
| 2004/0207366 A1 | 10/2004 | Sung |
| 2004/0211458 A1 | 10/2004 | Gui et al. |
| 2004/0223351 A1 | 11/2004 | Kurokami et al. |
| 2004/0233685 A1 | 11/2004 | Matsuo et al. |
| 2004/0246226 A1 | 12/2004 | Moon |
| 2004/0258141 A1 | 12/2004 | Tustison et al. |
| 2004/0264225 A1 | 12/2004 | Bhavaraju et al. |
| 2005/0002214 A1 | 1/2005 | Deng et al. |
| 2005/0005785 A1 | 1/2005 | Poss et al. |
| 2005/0006958 A1 | 1/2005 | Dubovsky |
| 2005/0017697 A1 | 1/2005 | Capel |
| 2005/0017701 A1 | 1/2005 | Hsu |
| 2005/0030772 A1 | 2/2005 | Phadke |
| 2005/0040800 A1 | 2/2005 | Sutardja |
| 2005/0057214 A1 | 3/2005 | Matan |
| 2005/0057215 A1 | 3/2005 | Matan |
| 2005/0068012 A1 | 3/2005 | Cutler |
| 2005/0068820 A1 | 3/2005 | Radosevich et al. |
| 2005/0099138 A1 | 5/2005 | Wilhelm |
| 2005/0103376 A1 | 5/2005 | Matsushita et al. |
| 2005/0105224 A1 | 5/2005 | Nishi |
| 2005/0105306 A1 | 5/2005 | Deng et al. |
| 2005/0110454 A1 | 5/2005 | Tsai et al. |
| 2005/0121067 A1 | 6/2005 | Toyomura et al. |
| 2005/0135031 A1 | 6/2005 | Colby et al. |
| 2005/0139258 A1 | 6/2005 | Liu et al. |
| 2005/0162018 A1 | 7/2005 | Realmuto et al. |
| 2005/0172995 A1 | 8/2005 | Rohrig et al. |
| 2005/0179420 A1 | 8/2005 | Satoh et al. |
| 2005/0194937 A1 | 9/2005 | Jacobs |
| 2005/0201397 A1 | 9/2005 | Petite |
| 2005/0213272 A1 | 9/2005 | Kobayashi |
| 2005/0225090 A1 | 10/2005 | Wobben |
| 2005/0226017 A1 | 10/2005 | Kotsopoulos et al. |
| 2005/0242795 A1 | 11/2005 | Al-Kuran et al. |
| 2005/0257827 A1 | 11/2005 | Gaudiana et al. |
| 2005/0269988 A1 | 12/2005 | Thrap |
| 2005/0275386 A1 | 12/2005 | Jepsen et al. |
| 2005/0275527 A1 | 12/2005 | Kates |
| 2005/0281064 A1 | 12/2005 | Olsen et al. |
| 2006/0001406 A1 | 1/2006 | Matan |
| 2006/0017327 A1 | 1/2006 | Siri et al. |
| 2006/0034106 A1 | 2/2006 | Johnson |
| 2006/0038692 A1 | 2/2006 | Schnetker |
| 2006/0043792 A1 | 3/2006 | Hjort et al. |
| 2006/0053447 A1 | 3/2006 | Krzyzanowski et al. |
| 2006/0066349 A1 | 3/2006 | Murakami |
| 2006/0068239 A1 | 3/2006 | Norimatsu et al. |
| 2006/0103360 A9 | 5/2006 | Cutler |
| 2006/0108979 A1 | 5/2006 | Daniel et al. |
| 2006/0113843 A1 | 6/2006 | Beveridge |
| 2006/0113979 A1 | 6/2006 | Ishigaki et al. |
| 2006/0118162 A1 | 6/2006 | Saelzer et al. |
| 2006/0132102 A1 | 6/2006 | Harvey |
| 2006/0149396 A1 | 7/2006 | Templeton |
| 2006/0162772 A1 | 7/2006 | Presher et al. |
| 2006/0163946 A1 | 7/2006 | Henne et al. |
| 2006/0164065 A1 | 7/2006 | Hoouk et al. |
| 2006/0171182 A1 | 8/2006 | Siri et al. |
| 2006/0174939 A1 | 8/2006 | Matan |
| 2006/0176029 A1 | 8/2006 | McGinty et al. |
| 2006/0176031 A1 | 8/2006 | Forman et al. |
| 2006/0176036 A1 | 8/2006 | Flatness et al. |
| 2006/0176716 A1 | 8/2006 | Balakrishnan et al. |
| 2006/0185727 A1 | 8/2006 | Matan |
| 2006/0192540 A1 | 8/2006 | Balakrishnan et al. |
| 2006/0208660 A1 | 9/2006 | Shinmura et al. |
| 2006/0222916 A1 | 10/2006 | Norimatsu et al. |
| 2006/0227578 A1 | 10/2006 | Datta et al. |
| 2006/0231132 A1 | 10/2006 | Neussner |
| 2006/0232220 A1 | 10/2006 | Melis |
| 2006/0235717 A1 | 10/2006 | Sharma et al. |
| 2006/0237058 A1 | 10/2006 | McClintock et al. |
| 2006/0261751 A1 | 11/2006 | Okabe et al. |
| 2006/0266408 A1 | 11/2006 | Horne et al. |
| 2006/0290317 A1 | 12/2006 | McNulty et al. |
| 2007/0001653 A1 | 1/2007 | Xu |
| 2007/0013349 A1 | 1/2007 | Bassett |
| 2007/0019613 A1 | 1/2007 | Frezzolini |
| 2007/0024257 A1 | 2/2007 | Boldo |
| 2007/0027644 A1 | 2/2007 | Bettenwort et al. |
| 2007/0030068 A1 | 2/2007 | Motonobu et al. |
| 2007/0035975 A1 | 2/2007 | Dickerson et al. |
| 2007/0040540 A1 | 2/2007 | Cutler |
| 2007/0044837 A1 | 3/2007 | Simburger et al. |
| 2007/0075689 A1 | 4/2007 | Kinder et al. |
| 2007/0075711 A1 | 4/2007 | Blanc et al. |
| 2007/0081364 A1 | 4/2007 | Andreycak |
| 2007/0089778 A1 | 4/2007 | Horne et al. |
| 2007/0103108 A1 | 5/2007 | Capp et al. |
| 2007/0107767 A1 | 5/2007 | Hayden et al. |
| 2007/0119718 A1 | 5/2007 | Gibson et al. |
| 2007/0121648 A1 | 5/2007 | Hahn |
| 2007/0133241 A1 | 6/2007 | Mumtaz et al. |
| 2007/0133421 A1 | 6/2007 | Young |
| 2007/0147075 A1 | 6/2007 | Bang |
| 2007/0158185 A1 | 7/2007 | Andelman et al. |
| 2007/0159866 A1 | 7/2007 | Siri |
| 2007/0164612 A1 | 7/2007 | Wendt et al. |
| 2007/0164750 A1 | 7/2007 | Chen et al. |
| 2007/0165347 A1 | 7/2007 | Wendt et al. |
| 2007/0205778 A1 | 9/2007 | Fabbro et al. |
| 2007/0209656 A1 | 9/2007 | Lee |
| 2007/0211888 A1 | 9/2007 | Corcoran et al. |
| 2007/0227574 A1 | 10/2007 | Cart |
| 2007/0235071 A1 | 10/2007 | Work et al. |
| 2007/0236187 A1 | 10/2007 | Wai et al. |
| 2007/0247877 A1 | 10/2007 | Kwon et al. |
| 2007/0271006 A1 | 11/2007 | Golden et al. |
| 2007/0273342 A1 | 11/2007 | Kataoka et al. |
| 2007/0273351 A1 | 11/2007 | Matan |
| 2007/0290636 A1 | 12/2007 | Beck et al. |
| 2007/0290656 A1 | 12/2007 | Lee Tai Keung |
| 2008/0021707 A1 | 1/2008 | Bou-Ghazale et al. |
| 2008/0024098 A1 | 1/2008 | Hojo |
| 2008/0036440 A1 | 2/2008 | Garmer |
| 2008/0055941 A1 | 3/2008 | Victor et al. |
| 2008/0080177 A1 | 4/2008 | Chang |
| 2008/0088184 A1 | 4/2008 | Tung et al. |
| 2008/0089277 A1 | 4/2008 | Alexander et al. |
| 2008/0097655 A1 | 4/2008 | Hadar et al. |
| 2008/0106250 A1 | 5/2008 | Prior et al. |
| 2008/0111529 A1 | 5/2008 | Shah et al. |
| 2008/0115823 A1 | 5/2008 | Kinsey |
| 2008/0121272 A1 | 5/2008 | Besser et al. |
| 2008/0122449 A1 | 5/2008 | Besser et al. |
| 2008/0122518 A1 | 5/2008 | Besser et al. |
| 2008/0136367 A1 | 6/2008 | Adest et al. |
| 2008/0142071 A1 | 6/2008 | Dorn et al. |
| 2008/0143188 A1 | 6/2008 | Adest et al. |
| 2008/0143462 A1 | 6/2008 | Belisle et al. |
| 2008/0144294 A1 | 6/2008 | Adest et al. |
| 2008/0147335 A1 | 6/2008 | Adest et al. |
| 2008/0149167 A1 | 6/2008 | Liu |
| 2008/0150366 A1 | 6/2008 | Adest et al. |
| 2008/0150484 A1 | 6/2008 | Kimball et al. |
| 2008/0164766 A1 | 7/2008 | Adest et al. |
| 2008/0179949 A1 | 7/2008 | Besser et al. |
| 2008/0191560 A1 | 8/2008 | Besser et al. |
| 2008/0191675 A1 | 8/2008 | Besser et al. |
| 2008/0192519 A1 | 8/2008 | Iwata et al. |
| 2008/0198523 A1 | 8/2008 | Schmidt et al. |
| 2008/0205096 A1 | 8/2008 | Lai et al. |
| 2008/0218152 A1 | 9/2008 | Bo |
| 2008/0224652 A1 | 9/2008 | Zhu et al. |
| 2008/0236647 A1 | 10/2008 | Gibson et al. |
| 2008/0236648 A1 | 10/2008 | Klein et al. |
| 2008/0238195 A1 | 10/2008 | Shaver et al. |
| 2008/0238372 A1 | 10/2008 | Cintra et al. |
| 2008/0246460 A1 | 10/2008 | Smith |
| 2008/0246463 A1 | 10/2008 | Sinton et al. |
| 2008/0252273 A1 | 10/2008 | Woo et al. |

(56) References Cited

U.S. PATENT DOCUMENTS

| | | |
|---|---|---|
| 2008/0264470 A1 | 10/2008 | Masuda et al. |
| 2008/0266919 A1 | 10/2008 | Mallwitz |
| 2008/0291707 A1 | 11/2008 | Fang |
| 2008/0294472 A1 | 11/2008 | Yamada |
| 2008/0303503 A1 | 12/2008 | Wolfs |
| 2008/0304296 A1 | 12/2008 | NadimpalliRaju et al. |
| 2008/0304298 A1 | 12/2008 | Toba et al. |
| 2009/0012917 A1 | 1/2009 | Thompson et al. |
| 2009/0014050 A1* | 1/2009 | Haaf .................. H01L 31/02021 136/244 |
| 2009/0014058 A1 | 1/2009 | Croft et al. |
| 2009/0015071 A1 | 1/2009 | Iwata et al. |
| 2009/0020151 A1 | 1/2009 | Fornage |
| 2009/0021877 A1 | 1/2009 | Fornage et al. |
| 2009/0039852 A1 | 2/2009 | Fishelov et al. |
| 2009/0066357 A1 | 3/2009 | Fornage |
| 2009/0066399 A1 | 3/2009 | Chen et al. |
| 2009/0069950 A1 | 3/2009 | Kurokami et al. |
| 2009/0073726 A1 | 3/2009 | Babcock |
| 2009/0078300 A1 | 3/2009 | Ang et al. |
| 2009/0080226 A1 | 3/2009 | Fornage |
| 2009/0084570 A1 | 4/2009 | Gherardini et al. |
| 2009/0097172 A1 | 4/2009 | Bremicker et al. |
| 2009/0101191 A1 | 4/2009 | Beck et al. |
| 2009/0102440 A1 | 4/2009 | Coles |
| 2009/0114263 A1 | 5/2009 | Powell et al. |
| 2009/0120485 A1 | 5/2009 | Kikinis |
| 2009/0121549 A1 | 5/2009 | Leonard |
| 2009/0133736 A1 | 5/2009 | Powell et al. |
| 2009/0140715 A1 | 6/2009 | Adest et al. |
| 2009/0141522 A1 | 6/2009 | Adest et al. |
| 2009/0145480 A1 | 6/2009 | Adest et al. |
| 2009/0146667 A1 | 6/2009 | Adest et al. |
| 2009/0146671 A1 | 6/2009 | Gazit |
| 2009/0147554 A1 | 6/2009 | Adest et al. |
| 2009/0150005 A1 | 6/2009 | Hadar et al. |
| 2009/0179662 A1 | 7/2009 | Moulton et al. |
| 2009/0182532 A1 | 7/2009 | Stoeber et al. |
| 2009/0184746 A1* | 7/2009 | Fahrenbruch ..... H01L 31/02021 327/427 |
| 2009/0189456 A1 | 7/2009 | Skutt |
| 2009/0190275 A1 | 7/2009 | Gilmore et al. |
| 2009/0195081 A1* | 8/2009 | Quardt .............. H01L 31/02021 307/125 |
| 2009/0206666 A1 | 8/2009 | Sella et al. |
| 2009/0207543 A1 | 8/2009 | Boniface et al. |
| 2009/0217965 A1 | 9/2009 | Dougal et al. |
| 2009/0224817 A1 | 9/2009 | Nakamura et al. |
| 2009/0234692 A1 | 9/2009 | Powell et al. |
| 2009/0237042 A1 | 9/2009 | Glovinski |
| 2009/0237043 A1 | 9/2009 | Glovinsky |
| 2009/0242011 A1 | 10/2009 | Proisy et al. |
| 2009/0273241 A1 | 11/2009 | Gazit et al. |
| 2009/0278496 A1 | 11/2009 | Nakao et al. |
| 2009/0282755 A1 | 11/2009 | Abbott et al. |
| 2009/0283129 A1 | 11/2009 | Foss |
| 2009/0283130 A1 | 11/2009 | Gilmore et al. |
| 2009/0284232 A1 | 11/2009 | Zhang et al. |
| 2009/0284998 A1 | 11/2009 | Zhang et al. |
| 2009/0295225 A1 | 12/2009 | Asplund et al. |
| 2009/0322494 A1 | 12/2009 | Lee |
| 2009/0325003 A1 | 12/2009 | Aberle et al. |
| 2010/0001587 A1 | 1/2010 | Casey et al. |
| 2010/0002349 A1* | 1/2010 | La Scala ........... H01L 31/02021 361/90 |
| 2010/0013452 A1 | 1/2010 | Tang et al. |
| 2010/0026097 A1 | 2/2010 | Avrutsky et al. |
| 2010/0052735 A1 | 3/2010 | Burkland et al. |
| 2010/0057267 A1 | 3/2010 | Liu et al. |
| 2010/0060000 A1 | 3/2010 | Scholte-Wassink |
| 2010/0085670 A1 | 4/2010 | Palaniswami et al. |
| 2010/0115093 A1 | 5/2010 | Rice |
| 2010/0124027 A1 | 5/2010 | Handelsman et al. |
| 2010/0124087 A1 | 5/2010 | Falk |
| 2010/0126550 A1 | 5/2010 | Foss |
| 2010/0127570 A1 | 5/2010 | Hadar et al. |
| 2010/0127571 A1 | 5/2010 | Hadar et al. |
| 2010/0132757 A1 | 6/2010 | He et al. |
| 2010/0132758 A1 | 6/2010 | Gilmore |
| 2010/0133911 A1 | 6/2010 | Williams et al. |
| 2010/0139734 A1 | 6/2010 | Hadar et al. |
| 2010/0139743 A1 | 6/2010 | Hadar et al. |
| 2010/0147362 A1 | 6/2010 | King et al. |
| 2010/0154858 A1 | 6/2010 | Jain |
| 2010/0176773 A1 | 7/2010 | Capel |
| 2010/0181957 A1 | 7/2010 | Goeltner |
| 2010/0191383 A1 | 7/2010 | Gaul |
| 2010/0206378 A1 | 8/2010 | Erickson, Jr. et al. |
| 2010/0207764 A1 | 8/2010 | Muhlberger et al. |
| 2010/0207770 A1 | 8/2010 | Thiemann |
| 2010/0208501 A1 | 8/2010 | Matan et al. |
| 2010/0214808 A1 | 8/2010 | Rodriguez |
| 2010/0217551 A1 | 8/2010 | Goff et al. |
| 2010/0229915 A1 | 9/2010 | Ledenev et al. |
| 2010/0241375 A1 | 9/2010 | Kumar et al. |
| 2010/0244575 A1 | 9/2010 | Coccia et al. |
| 2010/0264736 A1 | 10/2010 | Mumtaz et al. |
| 2010/0269430 A1 | 10/2010 | Haddock |
| 2010/0277001 A1 | 11/2010 | Wagoner |
| 2010/0282290 A1 | 11/2010 | Schwarze et al. |
| 2010/0286836 A1 | 11/2010 | Shaver, II et al. |
| 2010/0288327 A1 | 11/2010 | Lisi et al. |
| 2010/0294528 A1 | 11/2010 | Sella et al. |
| 2010/0294903 A1 | 11/2010 | Shmukler et al. |
| 2010/0295680 A1 | 11/2010 | Dumps |
| 2010/0297860 A1 | 11/2010 | Shmukler et al. |
| 2010/0301991 A1 | 12/2010 | Sella et al. |
| 2010/0308662 A1 | 12/2010 | Schatz et al. |
| 2010/0309692 A1 | 12/2010 | Chisenga et al. |
| 2010/0321148 A1 | 12/2010 | Gevorkian |
| 2010/0326809 A1 | 12/2010 | Lang et al. |
| 2010/0327657 A1 | 12/2010 | Kuran |
| 2010/0327659 A1 | 12/2010 | Lisi et al. |
| 2010/0332047 A1 | 12/2010 | Arditi et al. |
| 2011/0006743 A1 | 1/2011 | Fabbro |
| 2011/0012430 A1 | 1/2011 | Cheng et al. |
| 2011/0025130 A1 | 2/2011 | Hadar et al. |
| 2011/0031816 A1 | 2/2011 | Buthker et al. |
| 2011/0031946 A1 | 2/2011 | Egan et al. |
| 2011/0037600 A1 | 2/2011 | Takehara et al. |
| 2011/0043172 A1 | 2/2011 | Dearn |
| 2011/0049990 A1 | 3/2011 | Amaratunga et al. |
| 2011/0050190 A1 | 3/2011 | Avrutsky |
| 2011/0056533 A1 | 3/2011 | Kuan |
| 2011/0061705 A1 | 3/2011 | Croft et al. |
| 2011/0061713 A1 | 3/2011 | Powell et al. |
| 2011/0062784 A1 | 3/2011 | Wolfs |
| 2011/0068633 A1 | 3/2011 | Quardt et al. |
| 2011/0079263 A1 | 4/2011 | Avrutsky |
| 2011/0083733 A1 | 4/2011 | Marroquin et al. |
| 2011/0084553 A1 | 4/2011 | Adest et al. |
| 2011/0114154 A1 | 5/2011 | Lichy et al. |
| 2011/0115295 A1 | 5/2011 | Moon et al. |
| 2011/0121652 A1 | 5/2011 | Sella et al. |
| 2011/0125431 A1 | 5/2011 | Adest et al. |
| 2011/0132424 A1 | 6/2011 | Rakib |
| 2011/0133552 A1 | 6/2011 | Binder et al. |
| 2011/0139213 A1 | 6/2011 | Lee |
| 2011/0140536 A1 | 6/2011 | Adest et al. |
| 2011/0161722 A1 | 6/2011 | Makhota et al. |
| 2011/0172842 A1 | 7/2011 | Makhota et al. |
| 2011/0173276 A1 | 7/2011 | Eizips et al. |
| 2011/0181251 A1 | 7/2011 | Porter et al. |
| 2011/0181340 A1 | 7/2011 | Gazit |
| 2011/0198935 A1 | 8/2011 | Hinman et al. |
| 2011/0210610 A1 | 9/2011 | Mitsuoka et al. |
| 2011/0210611 A1 | 9/2011 | Ledenev et al. |
| 2011/0210612 A1 | 9/2011 | Leutwein |
| 2011/0218687 A1 | 9/2011 | Hadar et al. |
| 2011/0227411 A1 | 9/2011 | Arditi |
| 2011/0232714 A1 | 9/2011 | Bhavaraju et al. |
| 2011/0240100 A1 | 10/2011 | Lu et al. |
| 2011/0245989 A1 | 10/2011 | Makhota et al. |
| 2011/0246338 A1 | 10/2011 | Eich |

(56) References Cited

U.S. PATENT DOCUMENTS

| | | |
|---|---|---|
| 2011/0254372 A1 | 10/2011 | Haines et al. |
| 2011/0260866 A1 | 10/2011 | Avrutsky et al. |
| 2011/0267859 A1 | 11/2011 | Chapman |
| 2011/0271611 A1 | 11/2011 | Maracci et al. |
| 2011/0273015 A1 | 11/2011 | Adest et al. |
| 2011/0273016 A1 | 11/2011 | Adest et al. |
| 2011/0273302 A1 | 11/2011 | Fornage et al. |
| 2011/0285205 A1 | 11/2011 | Ledenev et al. |
| 2011/0290317 A1 | 12/2011 | Naumovitz et al. |
| 2011/0291486 A1 | 12/2011 | Adest et al. |
| 2011/0298288 A1 | 12/2011 | Cho et al. |
| 2011/0301772 A1 | 12/2011 | Zuercher et al. |
| 2011/0304204 A1 | 12/2011 | Avrutsky et al. |
| 2011/0304213 A1 | 12/2011 | Avrutsky et al. |
| 2011/0304215 A1 | 12/2011 | Avrutsky et al. |
| 2011/0316346 A1 | 12/2011 | Porter et al. |
| 2012/0007613 A1 | 1/2012 | Gazit |
| 2012/0019966 A1 | 1/2012 | DeBoer |
| 2012/0032515 A1 | 2/2012 | Ledenev et al. |
| 2012/0033392 A1 | 2/2012 | Golubovic et al. |
| 2012/0033463 A1 | 2/2012 | Rodriguez |
| 2012/0039099 A1 | 2/2012 | Rodriguez |
| 2012/0043818 A1 | 2/2012 | Stratakos et al. |
| 2012/0044014 A1 | 2/2012 | Stratakos et al. |
| 2012/0048325 A1 | 3/2012 | Matsuo et al. |
| 2012/0056483 A1 | 3/2012 | Capp et al. |
| 2012/0080943 A1 | 4/2012 | Phadke |
| 2012/0081009 A1 | 4/2012 | Shteynberg et al. |
| 2012/0081933 A1 | 4/2012 | Garrity |
| 2012/0081934 A1 | 4/2012 | Garrity et al. |
| 2012/0081937 A1 | 4/2012 | Phadke |
| 2012/0087159 A1 | 4/2012 | Chapman et al. |
| 2012/0091810 A1 | 4/2012 | Aiello et al. |
| 2012/0091817 A1 | 4/2012 | Seymour et al. |
| 2012/0098344 A1 | 4/2012 | Bergveld et al. |
| 2012/0113554 A1 | 5/2012 | Paoletti et al. |
| 2012/0119584 A1 | 5/2012 | Hadar et al. |
| 2012/0138123 A1 | 6/2012 | Newdoll et al. |
| 2012/0139343 A1 | 6/2012 | Adest et al. |
| 2012/0146420 A1 | 6/2012 | Wolfs |
| 2012/0161526 A1 | 6/2012 | Huang et al. |
| 2012/0161528 A1 | 6/2012 | Mumtaz et al. |
| 2012/0174961 A1 | 7/2012 | Larson et al. |
| 2012/0194003 A1 | 8/2012 | Schmidt et al. |
| 2012/0199172 A1 | 8/2012 | Avrutsky |
| 2012/0215367 A1 | 8/2012 | Eizips et al. |
| 2012/0217973 A1 | 8/2012 | Avrutsky |
| 2012/0240490 A1 | 9/2012 | Gangemi |
| 2012/0253533 A1 | 10/2012 | Eizips et al. |
| 2012/0253541 A1 | 10/2012 | Arditi et al. |
| 2012/0255591 A1 | 10/2012 | Arditi et al. |
| 2012/0274264 A1 | 11/2012 | Mun et al. |
| 2013/0026839 A1 | 1/2013 | Grana |
| 2013/0026840 A1 | 1/2013 | Arditi et al. |
| 2013/0026842 A1 | 1/2013 | Arditi et al. |
| 2013/0026843 A1 | 1/2013 | Arditi et al. |
| 2013/0038124 A1 | 2/2013 | Newdoll et al. |
| 2013/0049710 A1 | 2/2013 | Kraft et al. |
| 2013/0094262 A1 | 4/2013 | Avrutsky |
| 2013/0134790 A1 | 5/2013 | Amaratunga et al. |
| 2013/0181533 A1 | 7/2013 | Capp et al. |
| 2013/0192657 A1 | 8/2013 | Hadar et al. |
| 2013/0193765 A1 | 8/2013 | Yoscovich |
| 2013/0222144 A1 | 8/2013 | Hadar et al. |
| 2013/0229834 A1 | 9/2013 | Garrity et al. |
| 2013/0229842 A1 | 9/2013 | Garrity |
| 2013/0234518 A1 | 9/2013 | Mumtaz et al. |
| 2013/0235637 A1 | 9/2013 | Rodriguez |
| 2013/0279210 A1 | 10/2013 | Chisenga et al. |
| 2013/0294126 A1 | 11/2013 | Garrity et al. |
| 2013/0307556 A1 | 11/2013 | Ledenev et al. |
| 2013/0321013 A1 | 12/2013 | Pisklak et al. |
| 2013/0332093 A1 | 12/2013 | Adest et al. |
| 2014/0097808 A1 | 4/2014 | Clark et al. |
| 2014/0167715 A1 | 6/2014 | Wu et al. |
| 2014/0191583 A1 | 7/2014 | Chisenga et al. |
| 2014/0246915 A1 | 9/2014 | Mumtaz |
| 2014/0246927 A1 | 9/2014 | Mumtaz |
| 2014/0252859 A1 | 9/2014 | Chisenga et al. |
| 2014/0265579 A1 | 9/2014 | Mumtaz |
| 2014/0265629 A1 | 9/2014 | Gazit et al. |
| 2014/0265638 A1 | 9/2014 | Orr et al. |
| 2014/0306543 A1 | 10/2014 | Garrity et al. |
| 2014/0327313 A1 | 11/2014 | Arditi et al. |
| 2015/0022006 A1 | 1/2015 | Garrity et al. |
| 2015/0028683 A1 | 1/2015 | Hadar et al. |
| 2015/0028692 A1 | 1/2015 | Makhota et al. |
| 2015/0188415 A1 | 7/2015 | Abido et al. |
| 2015/0364918 A1 | 12/2015 | Singh et al. |

FOREIGN PATENT DOCUMENTS

| | | |
|---|---|---|
| CA | 1183574 A1 | 3/1985 |
| CA | 2063243 A1 | 12/1991 |
| CA | 2301657 A1 | 3/1999 |
| CA | 2394761 A1 | 6/2001 |
| CA | 2658087 A1 | 6/2001 |
| CA | 2443450 A1 | 3/2005 |
| CA | 2572452 A1 | 1/2006 |
| CA | 2613038 A1 | 1/2007 |
| CA | 2704605 A1 | 5/2009 |
| CN | 2305016 Y | 1/1999 |
| CN | 1244745 A | 2/2000 |
| CN | 1262552 A | 8/2000 |
| CN | 1064487 C | 4/2001 |
| CN | 1309451 A | 8/2001 |
| CN | 1362655 A | 8/2002 |
| CN | 2514538 Y | 10/2002 |
| CN | 1122905 C | 10/2003 |
| CN | 1474492 A | 2/2004 |
| CN | 1523726 A | 8/2004 |
| CN | 1185782 C | 1/2005 |
| CN | 2672938 Y | 1/2005 |
| CN | 1245795 C | 3/2006 |
| CN | 1787717 A | 6/2006 |
| CN | 1841254 A | 10/2006 |
| CN | 1841823 A | 10/2006 |
| CN | 1892239 A | 1/2007 |
| CN | 1902809 A | 1/2007 |
| CN | 1929276 A | 3/2007 |
| CN | 1930925 A | 3/2007 |
| CN | 101030752 A | 9/2007 |
| CN | 101050770 A | 10/2007 |
| CN | 101107712 A | 1/2008 |
| CN | 100371843 C | 2/2008 |
| CN | 101136129 A | 3/2008 |
| CN | 101180781 A | 5/2008 |
| CN | 100426175 C | 10/2008 |
| CN | 201203438 Y | 3/2009 |
| CN | 101488271 A | 7/2009 |
| CN | 101523230 A | 9/2009 |
| CN | 101953060 A | 1/2011 |
| CN | 102089883 A | 6/2011 |
| CN | 202103601 U | 1/2012 |
| CN | 202178274 U | 3/2012 |
| CN | 202871823 U | 4/2013 |
| CN | 203367304 U | 12/2013 |
| DE | 3236071 A1 | 1/1984 |
| DE | 3525630 A1 | 1/1987 |
| DE | 3729000 A1 | 3/1989 |
| DE | 4019710 A1 | 1/1992 |
| DE | 4032569 A1 | 4/1992 |
| DE | 4232356 A1 | 3/1994 |
| DE | 4325436 A1 | 2/1995 |
| DE | 4328511 A1 | 3/1995 |
| DE | 19515786 A1 | 11/1995 |
| DE | 19502762 A1 | 8/1996 |
| DE | 19538946 C1 | 4/1997 |
| DE | 19609189 A1 | 9/1997 |
| DE | 19618882 A1 | 11/1997 |
| DE | 19701897 A1 | 7/1998 |
| DE | 19718046 A1 | 11/1998 |
| DE | 19732218 C1 | 3/1999 |
| DE | 19737286 A1 | 3/1999 |

(56) References Cited

FOREIGN PATENT DOCUMENTS

| | | |
|---|---|---|
| DE | 19838230 A1 | 2/2000 |
| DE | 19846818 A1 | 4/2000 |
| DE | 19904561 C1 | 8/2000 |
| DE | 19928809 A1 | 1/2001 |
| DE | 019937410 A1 | 2/2001 |
| DE | 19961705 A1 | 7/2001 |
| DE | 10064039 A1 | 12/2001 |
| DE | 10060108 A1 | 6/2002 |
| DE | 10103431 A1 | 8/2002 |
| DE | 10136147 A1 | 2/2003 |
| DE | 10222621 A1 | 11/2003 |
| DE | 202004001246 U1 | 4/2004 |
| DE | 10345302 A1 | 4/2005 |
| DE | 102004043478 A1 | 4/2005 |
| DE | 102004037446 A1 | 6/2006 |
| DE | 69734495 T2 | 7/2006 |
| DE | 69735169 T2 | 8/2006 |
| DE | 102005018173 A1 | 10/2006 |
| DE | 102005020937 A1 | 11/2006 |
| DE | 102005036153 A1 | 12/2006 |
| DE | 102005030907 A1 | 1/2007 |
| DE | 102005032864 A1 | 1/2007 |
| DE | 102006023563 A1 | 11/2007 |
| DE | 102006026073 A1 | 12/2007 |
| DE | 102007051134 A1 | 3/2009 |
| DE | 102007050031 B3 | 4/2009 |
| DE | 102008057874 A1 | 5/2010 |
| DE | 102009051186 A1 | 5/2010 |
| DE | 102010023549 A1 | 12/2011 |
| DE | 102013106255 A1 | 12/2014 |
| EP | 0027405 A1 | 4/1981 |
| EP | 169673 A1 | 1/1986 |
| EP | 0178757 A2 | 4/1986 |
| EP | 0206253 A1 | 12/1986 |
| EP | 0231211 A1 | 8/1987 |
| EP | 0293219 A2 | 11/1988 |
| EP | 0340006 A2 | 11/1989 |
| EP | 419093 A2 | 3/1991 |
| EP | 420295 A1 | 4/1991 |
| EP | 0521467 A2 | 1/1993 |
| EP | 0576271 A2 | 12/1993 |
| EP | 0577334 A2 | 1/1994 |
| EP | 604777 A1 | 7/1994 |
| EP | 0628901 A2 | 12/1994 |
| EP | 0642199 A1 | 3/1995 |
| EP | 0670915 A1 | 9/1995 |
| EP | 756178 A2 | 1/1997 |
| EP | 0756372 A1 | 1/1997 |
| EP | 0780750 A2 | 6/1997 |
| EP | 0809293 A1 | 11/1997 |
| EP | 827254 A2 | 3/1998 |
| EP | 0895146 A1 | 2/1999 |
| EP | 0906660 A1 | 4/1999 |
| EP | 0947905 A2 | 10/1999 |
| EP | 1012886 A1 | 6/2000 |
| EP | 1024575 A2 | 8/2000 |
| EP | 1034465 A1 | 9/2000 |
| EP | 1035640 A1 | 9/2000 |
| EP | 1039361 A1 | 9/2000 |
| EP | 1039620 A2 | 9/2000 |
| EP | 1039621 A2 | 9/2000 |
| EP | 1047179 A1 | 10/2000 |
| EP | 1130770 A2 | 9/2001 |
| EP | 1143594 A2 | 10/2001 |
| EP | 1187291 A2 | 3/2002 |
| EP | 1235339 A2 | 8/2002 |
| EP | 1239573 A1 | 9/2002 |
| EP | 1239576 A2 | 9/2002 |
| EP | 1254505 A2 | 11/2002 |
| EP | 1271742 A2 | 1/2003 |
| EP | 1330009 A2 | 7/2003 |
| EP | 1339153 A2 | 8/2003 |
| EP | 1369983 A1 | 12/2003 |
| EP | 1376706 A2 | 1/2004 |
| EP | 1388774 A1 | 2/2004 |
| EP | 1400988 A2 | 3/2004 |
| EP | 1407534 A2 | 4/2004 |
| EP | 1418482 A1 | 5/2004 |
| EP | 1429393 A2 | 6/2004 |
| EP | 1442473 A2 | 8/2004 |
| EP | 1447561 A1 | 8/2004 |
| EP | 1457857 A2 | 9/2004 |
| EP | 1463188 A2 | 9/2004 |
| EP | 1475882 A2 | 11/2004 |
| EP | 1503490 A1 | 2/2005 |
| EP | 1521345 A1 | 4/2005 |
| EP | 1526633 A2 | 4/2005 |
| EP | 1531542 A2 | 5/2005 |
| EP | 1531545 A2 | 5/2005 |
| EP | 1532727 A2 | 5/2005 |
| EP | 1552563 A2 | 7/2005 |
| EP | 1562281 A1 | 8/2005 |
| EP | 1580862 A1 | 9/2005 |
| EP | 1603212 A2 | 12/2005 |
| EP | 1610571 A2 | 12/2005 |
| EP | 1623495 A1 | 2/2006 |
| EP | 1657557 A1 | 5/2006 |
| EP | 1657797 A1 | 5/2006 |
| EP | 1691246 A2 | 8/2006 |
| EP | 1706937 A1 | 10/2006 |
| EP | 1708070 A1 | 10/2006 |
| EP | 1716272 A1 | 11/2006 |
| EP | 1728413 A1 | 12/2006 |
| EP | 1750193 A1 | 2/2007 |
| EP | 1766490 A1 | 3/2007 |
| EP | 1782146 A2 | 5/2007 |
| EP | 1785800 A1 | 5/2007 |
| EP | 1842121 A2 | 10/2007 |
| EP | 1859362 A1 | 11/2007 |
| EP | 1887675 A2 | 2/2008 |
| EP | 1901419 A2 | 3/2008 |
| EP | 1902349 A2 | 3/2008 |
| EP | 1911101 A1 | 4/2008 |
| EP | 2048679 A1 | 4/2009 |
| EP | 2061088 A2 | 5/2009 |
| EP | 2092625 A2 | 8/2009 |
| EP | 2092631 A2 | 8/2009 |
| EP | 2135348 A2 | 12/2009 |
| EP | 2144133 A1 | 1/2010 |
| EP | 2206159 A1 | 7/2010 |
| EP | 2232690 A1 | 9/2010 |
| EP | 2256819 A1 | 12/2010 |
| EP | 2315328 A2 | 4/2011 |
| EP | 2355268 A1 | 8/2011 |
| EP | 2374190 A1 | 10/2011 |
| EP | 2393178 A2 | 12/2011 |
| EP | 2495766 A1 | 9/2012 |
| EP | 2533299 A1 | 12/2012 |
| EP | 2549635 A1 | 1/2013 |
| EP | 2561596 A2 | 2/2013 |
| EP | 2621045 A2 | 7/2013 |
| EP | 2666222 A1 | 11/2013 |
| EP | 2722979 A1 | 4/2014 |
| EP | 2779251 A1 | 9/2014 |
| ES | 2249147 A1 | 3/2006 |
| ES | 2249149 A1 | 3/2006 |
| FR | 2796216 A1 | 1/2001 |
| FR | 2819653 A1 | 7/2002 |
| GB | 1211885 A | 11/1970 |
| GB | 1261838 A | 1/1972 |
| GB | 1571681 A | 7/1980 |
| GB | 1597508 A | 9/1981 |
| GB | 2327208 A | 1/1999 |
| GB | 2339465 A | 1/2000 |
| GB | 2376801 A | 12/2002 |
| GB | 2399463 A | 9/2004 |
| GB | 2399465 A | 9/2004 |
| GB | 2415841 A | 1/2006 |
| GB | 2419968 A | 5/2006 |
| GB | 2421847 A | 7/2006 |
| GB | 2476508 A | 6/2011 |
| GB | 2480015 A | 11/2011 |
| GB | 2480015 B | 11/2011 |
| GB | 2482653 A | 2/2012 |

(56) References Cited

FOREIGN PATENT DOCUMENTS

| | | | |
|---|---|---|---|
| GB | 2483317 | A | 3/2012 |
| GB | 2485527 | A | 5/2012 |
| GB | 2486408 | A | 6/2012 |
| GB | 2487368 | A | 7/2012 |
| GB | 2497275 | A | 6/2013 |
| GB | 2498365 | A | 7/2013 |
| GB | 2498790 | A | 7/2013 |
| GB | 2498791 | A | 7/2013 |
| GB | 2499991 | A | 9/2013 |
| JP | 61065320 | A | 4/1986 |
| JP | H01311874 | A | 12/1989 |
| JP | H04219982 | A | 8/1992 |
| JP | H04364378 | A | 12/1992 |
| JP | 8009557 | A | 1/1996 |
| JP | H0897460 | A | 4/1996 |
| JP | H08116628 | A | 5/1996 |
| JP | H08185235 | A | 7/1996 |
| JP | H08227324 | A | 9/1996 |
| JP | H08316517 | A | 11/1996 |
| JP | H08317664 | A | 11/1996 |
| JP | H094692 | A | 1/1997 |
| JP | H09148611 | A | 6/1997 |
| JP | H09275644 | A | 10/1997 |
| JP | 2676789 | B2 | 11/1997 |
| JP | H1017445 | A | 1/1998 |
| JP | H1075580 | A | 3/1998 |
| JP | H10201086 | A | 7/1998 |
| JP | H10285966 | A | 10/1998 |
| JP | -110308523 | A | 11/1998 |
| JP | H10308523 | A | 11/1998 |
| JP | H1110353 | A | 1/1999 |
| JP | 11041832 | A | 2/1999 |
| JP | H1146457 | A | 2/1999 |
| JP | 11103538 | A | 4/1999 |
| JP | 2892183 | B2 | 5/1999 |
| JP | 11206038 | A | 7/1999 |
| JP | H11266545 | A | 9/1999 |
| JP | 11289891 | A | 10/1999 |
| JP | 11318042 | A | 11/1999 |
| JP | 2000020150 | A | 1/2000 |
| JP | 3015512 | B2 | 3/2000 |
| JP | 2000160789 | A | 6/2000 |
| JP | 2000166097 | A | 6/2000 |
| JP | 2000174307 | A | 6/2000 |
| JP | 2000232791 | A | 8/2000 |
| JP | 2000232793 | A | 8/2000 |
| JP | 2000316282 | A | 11/2000 |
| JP | 2000324852 | A | 11/2000 |
| JP | 2000339044 | A | 12/2000 |
| JP | 2000341974 | A | 12/2000 |
| JP | 2000347753 | A | 12/2000 |
| JP | 2000358330 | A | 12/2000 |
| JP | 2001060120 | A | 3/2001 |
| JP | 2001075662 | A | 3/2001 |
| JP | 2001178145 | A | 6/2001 |
| JP | 2001189476 | A | 7/2001 |
| JP | 2001224142 | A | 8/2001 |
| JP | 2001250964 | A | 9/2001 |
| JP | 2002073184 | A | 3/2002 |
| JP | 2002238246 | A | 8/2002 |
| JP | 2002270876 | A | 9/2002 |
| JP | 2002300735 | A | 10/2002 |
| JP | 2002339591 | A | 11/2002 |
| JP | 2002354677 | A | 12/2002 |
| JP | 2003102134 | A | 4/2003 |
| JP | 2003124492 | A | 4/2003 |
| JP | 2003134661 | A | 5/2003 |
| JP | 2003134667 | A | 5/2003 |
| JP | 2003282916 | A | 10/2003 |
| JP | 2003289674 | A | 10/2003 |
| JP | 2004055603 | A | 2/2004 |
| JP | 2004111754 | A | 4/2004 |
| JP | 2004194500 | A | 7/2004 |
| JP | 2004260944 | A | 9/2004 |
| JP | 2004312994 | A | 11/2004 |
| JP | 2004334704 | A | 11/2004 |
| JP | 3656531 | B2 | 6/2005 |
| JP | 2005192314 | A | 7/2005 |
| JP | 2005251039 | A | 9/2005 |
| JP | 2006041440 | A | 2/2006 |
| JP | 2006262619 | A | 9/2006 |
| JP | 2007058845 | A | 3/2007 |
| JP | 2010-146047 | | 7/2010 |
| JP | 2010245532 | A | 10/2010 |
| JP | 2012511299 | A | 5/2012 |
| JP | 2012178535 | A | 9/2012 |
| KR | 20010044490 | A | 6/2001 |
| KR | 20040086088 | A | 10/2004 |
| KR | 100468127 | B1 | 1/2005 |
| KR | 200402282 | Y1 | 11/2005 |
| KR | 100725755 | B1 | 5/2007 |
| KR | 100912892 | B1 | 8/2009 |
| NL | 1011483 | C2 | 9/2000 |
| WO | 8202134 | A1 | 6/1982 |
| WO | 8403402 | A1 | 8/1984 |
| WO | 8804801 | A1 | 6/1988 |
| WO | 9207418 | A1 | 4/1992 |
| WO | 9313587 | A1 | 7/1993 |
| WO | 9607130 | A1 | 3/1996 |
| WO | 9613093 | A1 | 5/1996 |
| WO | 9823021 | A2 | 5/1998 |
| WO | 9928801 | A1 | 6/1999 |
| WO | 00/00839 | A1 | 1/2000 |
| WO | 00/21178 | A1 | 4/2000 |
| WO | 0075947 | A1 | 12/2000 |
| WO | 0077522 | A1 | 12/2000 |
| WO | 0147095 | A2 | 6/2001 |
| WO | 0231517 | | 4/2002 |
| WO | 02056126 | A1 | 7/2002 |
| WO | 0278164 | A1 | 10/2002 |
| WO | 02078164 | A1 | 10/2002 |
| WO | 02093655 | A1 | 11/2002 |
| WO | 03012569 | A1 | 2/2003 |
| WO | 2003012569 | | 2/2003 |
| WO | 03/026114 | A2 | 3/2003 |
| WO | 03050938 | A2 | 6/2003 |
| WO | 03071655 | A1 | 8/2003 |
| WO | 03084041 | A1 | 10/2003 |
| WO | 2003098703 | | 11/2003 |
| WO | 2004001942 | A1 | 12/2003 |
| WO | 2004006342 | A1 | 1/2004 |
| WO | 2004008619 | A2 | 1/2004 |
| WO | 2004023278 | A2 | 3/2004 |
| WO | 2004053993 | A1 | 6/2004 |
| WO | 2004090993 | A2 | 10/2004 |
| WO | 2004098261 | A2 | 11/2004 |
| WO | 2004100344 | A2 | 11/2004 |
| WO | 2004100348 | A1 | 11/2004 |
| WO | 2004107543 | A2 | 12/2004 |
| WO | 2005015584 | A2 | 2/2005 |
| WO | 2005027300 | A1 | 3/2005 |
| WO | 2005053189 | A1 | 6/2005 |
| WO | 2005069096 | A1 | 7/2005 |
| WO | 2005076444 | A1 | 8/2005 |
| WO | 2005076445 | A1 | 8/2005 |
| WO | 2005089030 | A1 | 9/2005 |
| WO | 2005112551 | A2 | 12/2005 |
| WO | 2005119609 | A2 | 12/2005 |
| WO | 2005124498 | A1 | 12/2005 |
| WO | 2006002380 | A2 | 1/2006 |
| WO | 2006005125 | A1 | 1/2006 |
| WO | 2006007198 | A1 | 1/2006 |
| WO | 2006011071 | A2 | 2/2006 |
| WO | 2006011359 | A1 | 2/2006 |
| WO | 2006013600 | A2 | 2/2006 |
| WO | 2006048688 | A1 | 5/2006 |
| WO | 2006048689 | A2 | 5/2006 |
| WO | 2006071436 | A2 | 7/2006 |
| WO | 2006078685 | A2 | 7/2006 |
| WO | 2006079503 | A2 | 8/2006 |
| WO | 2006089778 | A2 | 8/2006 |
| WO | 2006110613 | A2 | 10/2006 |
| WO | 2006130520 | A2 | 12/2006 |
| WO | 2007006564 | A2 | 1/2007 |

(56) References Cited

FOREIGN PATENT DOCUMENTS

| WO | 2007007360 A2 | 1/2007 |
|---|---|---|
| WO | 2007010326 A1 | 1/2007 |
| WO | 2007048421 A2 | 5/2007 |
| WO | 2007072517 A1 | 6/2007 |
| WO | 2007073951 A1 | 7/2007 |
| WO | 2007080429 A2 | 7/2007 |
| WO | 2007084196 A2 | 7/2007 |
| WO | 2007090476 A2 | 8/2007 |
| WO | 2007113358 A1 | 10/2007 |
| WO | 2007124518 A1 | 11/2007 |
| WO | 2008008528 A2 | 1/2008 |
| WO | 2008026207 A2 | 3/2008 |
| WO | 2008/046370 A1 | 4/2008 |
| WO | 2008041983 A2 | 4/2008 |
| WO | 2008077473 A2 | 7/2008 |
| WO | 2008097591 A2 | 8/2008 |
| WO | 2008119034 A1 | 10/2008 |
| WO | 2008125915 A2 | 10/2008 |
| WO | 2008132551 A2 | 11/2008 |
| WO | 2008132553 A2 | 11/2008 |
| WO | 2008142480 A2 | 11/2008 |
| WO | 2009006879 A1 | 1/2009 |
| WO | 2009007782 A2 | 1/2009 |
| WO | 2009020917 A2 | 2/2009 |
| WO | 2009046533 A1 | 4/2009 |
| WO | 2009051221 A1 | 4/2009 |
| WO | 2009051222 A1 | 4/2009 |
| WO | 2009051853 A1 | 4/2009 |
| WO | 2009056957 A2 | 5/2009 |
| WO | 2009059028 A2 | 5/2009 |
| WO | 2009064683 A2 | 5/2009 |
| WO | 2009/072075 A2 | 6/2009 |
| WO | 2009/073867 A1 | 6/2009 |
| WO | 2009072077 A1 | 6/2009 |
| WO | 2009073995 A1 | 6/2009 |
| WO | 2009114341 A2 | 9/2009 |
| WO | 2009118682 A2 | 10/2009 |
| WO | 2009118683 A2 | 10/2009 |
| WO | 2009073868 A1 | 11/2009 |
| WO | 2009136358 A1 | 11/2009 |
| WO | 2009155392 A1 | 12/2009 |
| WO | 2010/002960 A1 | 1/2010 |
| WO | 2010014116 A1 | 2/2010 |
| WO | 2010037393 A1 | 4/2010 |
| WO | 2010062662 A2 | 6/2010 |
| WO | 2010065043 A1 | 6/2010 |
| WO | 2010065388 A1 | 6/2010 |
| WO | 2010072717 A1 | 7/2010 |
| WO | 2010078303 A2 | 7/2010 |
| WO | 2010080672 A2 | 7/2010 |
| WO | 2010091025 A2 | 8/2010 |
| WO | 2010094012 A1 | 8/2010 |
| WO | 2010/132369 A1 | 11/2010 |
| WO | 2010134057 A1 | 11/2010 |
| WO | 2011005339 A1 | 1/2011 |
| WO | 2011011711 A2 | 1/2011 |
| WO | 2011014275 A1 | 2/2011 |
| WO | 2011017721 A1 | 2/2011 |
| WO | 2011023732 A2 | 3/2011 |
| WO | 2011028456 A2 | 3/2011 |
| WO | 2011028457 A2 | 3/2011 |
| WO | 2011059067 A1 | 5/2011 |
| WO | 2011074025 A1 | 6/2011 |
| WO | 2011085259 A2 | 7/2011 |
| WO | 2011119587 A2 | 9/2011 |
| WO | 2011133843 A2 | 10/2011 |
| WO | 2011133928 A2 | 10/2011 |
| WO | 2011151672 A1 | 12/2011 |
| WO | 2013015921 A1 | 1/2013 |
| WO | 9823021 A | 7/2013 |
| WO | 2013130563 A1 | 9/2013 |

OTHER PUBLICATIONS

International Patent Application PCT/US13/027965, International Search Report and Written Opinion, Jun. 2, 2013.
International Application No. PCT/US12/44045, International Preliminary Examination Report, Jan. 28, 2014.
International Patent Application No. PCT/US2012/044045, International Search Report and Written Opinion, Jan. 2, 2013.
International Patent Application No. PCT/US2009/047734, International Search Report and Written Opinion, May 4, 2010.
Linares, Leonor et al., "Improved Energy Capture in Series String Photovoltaics via Smart Distributed Power Electronics," 24th Annual IEEE Applied Power Electronics Conference and Exposition, pp. 904-910, Feb. 15, 2009.
International Patent Application No. PCT/US2010/029929, International Search Report and Written Opinion, Oct. 27, 2010.
International Patent Application No. PCT/US2011/020591, International Search Report and Written Opinion, Aug. 8, 2011.
International Patent Application No. PCT/US2011/033544, International Search Report and Written Opinion, Nov. 24, 2011.
J. Keller and B. Kroposki, titled, "Understanding Fault Characteristics of Inverter-Based Distributed Energy Resources", in a Technical Report NREL/TP-550-46698, published Jan. 2010, pp. 1 through 48.
International Patent Application No. PCT/US2008/081827, International Search Report and Written Opinion, Jun. 24, 2009.
International Patent Application No. PCT/US2010/046274 International Search Report and Written Opinion, Apr. 22, 2011.
International Patent Application No. PCT/US2011/033658, International Search Report and Written Opinion, Jan. 13, 2012.
International Patent Application No. PCT/US2011/029392, International Search Report and Written Opinion, Oct. 24, 2011
European Patent Application No. 09829487.9, Extended Search Report, Apr. 21, 2011.
International Patent Application No. PCT/US2009/062536, International Search Report and Written Opinion, Jun. 17, 2010.
International Patent Application No. PCT/US2010/022915, International Search Report and Written Opinion, Aug. 23, 2010.
International Patent Application No. PCT/US2010/046272, International Search Report and Written Opinion, Mar. 31, 2011.
International Patent Application No. PCT/US2010/029936, International Search Report and Written Opinion, Nov. 12, 2010.
International Patent Application No. PCT/US08/75127, International Search Report and Written Opinion, Apr. 28, 2009.
International Patent Application No. PCT/US09/35890, International Search Report and Written Opinion, Oct. 1, 2009.
European Patent Appilcation No. 08845104.2, Extended Search Report, Jul. 31, 2014.
European Patent Appilcation No. 11772811.3, Extended Search Report, Dec. 15, 2014.
International Patent Application No. PCT/US2008/082935, International Search Report and Written Opinion, Jun. 25, 2009.
Rodriguez, C., and G. A. J. Amaratunga. "Dynamic stability of grid-connected photovoltaic systems." Power Engineering Society General Meeting, 2004. IEEE, pp. 2194-2200.
Kikuchi, Naoto, et al. "Single phase amplitude modulation inverter for utility interaction photovoltaic system." Industrial Electronics Society, 1999. IECON'99 Proceedings. The 25th Annual Conference of the IEEE. vol. 1. IEEE, 1999.
Nonaka, Sakutaro, et al. "Interconnection system with single phase IGBT PWM CSI between photovoltaic arrays and the utility line." Industry Applications Society Annual Meeting, 1990., Conference Record of the 1990 IEEE.
Calais, Martina, et al. "Inverters for single-phase grid connected photovoltaic systems-an overview." Power Electronics Specialists Conference, 2002. pesc 02. 2002 IEEE 33rd Annual. vol. 4. IEEE, 2002.

(56) References Cited

OTHER PUBLICATIONS

Marra, Enes Goncalves, and José Antenor Pomilio. "Self-excited induction generator controlled by a VS-PWM bidirectional converter for rural applications." Industry Applications, IEEE Transactions on 35.4 (1999): 877-883.
Xiaofeng Sun, Weiyang Wu, Xin Li, Qinglin Zhao: A Research on Photovoltaic Energy Controlling System with Maximum Power Point Tracking:; Proceedings of the Power Conversion Conference-Osaka 2002 (Cat. No. 02TH8579) IEEE-Piscataway, NJ, USA, ISBN 0-7803-7156-9, vol. 2, p. 822-826, XP010590259: the whole document.
International Search Report for corresponding PCT/GB2005/050198 completed Jun. 28, 2006 by C. Wirner of the EPO.
Brunello, Gustavo, et al., "Shunt Capacitor Bank Fundamentals and Protection," 2003 Conference for Protective Relay Engineers, Apr. 8-10, 2003, pp. 1-17, Texas A&M University, College Station, TX, USA.
Cordonnier, Charles-Edouard, et al., "Application Considerations for Sensefet Power Devices," PCI Proceedings, May 11, 1987, pp. 47-65.
Kotsopoulos, Andrew, et al., "Predictive DC Voltage Control of Single-Phase PV Inverters with Small DC Link Capacitance," IEEE International Symposium, Month Unknown, 2003, pp. 793-797.
Meinhardt, Mike, et al., "Multi-String-Converter with Reduced Specific Costs and Enhanced Functionality," Solar Energy, May 21, 2001, pp. 217-227, vol. 69, Elsevier Science Ltd.
Kimball, et al.: "Analysis and Design of Switched Capacitor Converters"; Grainger Center for Electric Machinery and Electromechanics, University of Illinois at Urbana-Champaign, 1406 W. Green St, Urbana, IL 61801 USA, © 2005 IEEE; pp. 1473-1477.
Martins, et al.: "Interconnection of a Photovoltaic Panels Array to a Single-Phase Utility Line From a Static Conversion System"; Power Electronics Specialists Conference, 2000. PESC 00. 2000 IEEE 31st Annual; Jun. 18, 2000-Jun. 23, 2000; ISSN: 0275-9306; pp. 1207-1211, vol. 3.
International Search Report for corresponding PCT/GB2005/050197, completed Dec. 20, 2005 by K-R Zettler of the EPO.
Kjaer, Soeren Baekhoej, et al., "Design Optimization of a Single Phase Inverter for Photovoltaic Applications," IEEE 34th Annual Power Electronics Specialist Conference, Jun. 15-19, 2003, pp. 1183-1190, vol. 3, IEEE.
Shimizu, Toshihisa, et al., "A Flyback-type Single Phase Utility Interactive Inverter with Low-frequency Ripple Current Reduction on the DC Input for an AC Photovoltaic Module System," IEEE 33rd Annual Power Electronics Specialist Conference, Month Unknown, 2002, pp. 1483-1488, vol. 3, IEEE.
Written Opinion of PCT/GB2005/050197, Feb. 14, 2006 (mailing date), Enecsys Limited.
Yatsuki, Satoshi, et al., "A Novel AC Photovoltaic Module System based on the Impedance-Admittance Conversion Theory," IEEE 32nd Annual Power Electronics Specialists Conference, Month Unknown, 2001, pp. 2191-2196, vol. 4, IEEE.
International Search Report for corresponding PCT/GB2004/001965, completed Aug. 16, 2004 by A. Roider.
Naik et al., A Novel Grid Interface for Photovoltaic, Wind-Electric, and Fuel-Cell Systems With a Controllable Power Factor or Operation, IEEE, 1995, pp. 995-998.
Petkanchin, Processes following changes of phase angle between current and voltage in electric circuits, Aug. 1999, Power Engineering Review, IEEE vol. 19, Issue 8, pp. 59-60.
Mumtaz, Asim, et al., "Grid Connected PV Inverter Using a Commercially Available Power IC," PV in Europe Conference, Oct. 2002, 3 pages, Rome, Italy.
Koutroulis, Eftichios, et al., "Development of a Microcontroller-Based, Photovoltaic Maximum Power Point Tracking Control System," IEEE Transactions on Power Electronics, Jan. 2001, pp. 46-54, vol. 16, No. 1, IEEE.
GB Combined Search and Examination Report—GB1203763.6—Mailing date: Jun. 25, 2012.

Mohammad Reza Amini et al., "Quasi Resonant DC Link Inverter with a Simple Auxiliary Circuit", Journal of Power Electronics, vol. 11, No. 1, Jan. 2011.
Khairy Fathy et al., "A Novel Quasi-Resonant Snubber-Assisted ZCS-PWM DC-DC Converter with High Frequency Link", Journal of Power Electronics, vol. 7, No. 2, Apr. 2007.
Cheng K.W.E., "New Generation of Switched Capacitor Converters", Department of Electrical Engineering, The Hong Kong Polytechnic University, Hung Hom, Hong Kong, Power Electronics Conference, 1998, PESC 98.
Per Karlsson, "Quasi Resonant DC Link Converters—Analysis and Design for a Battery Charger Application", Universitetstryckeriet, Lund University, 1999, ISBN 91-88934-14-4.
Hsiao Sung-Hsin et al., "ZCS Switched-Capacitor Bidirectional Converters with Secondary Output Power Amplifier for Biomedical Applications", Power Electronics Conference (IPEC) Jun. 21, 2010.
Yuang-Shung Lee et al.,"A Novel QR ZCS Switched-Capacitor Bidirectional Converter", IEEE, 2007.
Antti Tolvanen et al., "Seminar on Solar Simulation Standards and Measurement Principles", May 9th, 2006 Hawaii.
J.A. Eikelboom and M.J. Jansen, "Characterisation of PV Modules of New Generations—Results of tests and simulations", Jun. 2000.
Yeong-Chau Kuo et al., "Novel Maximum-Power-Point-Tracking Controller for Photovoltaic Energy Conversion System", IEEE Transactions on Industrial Electronics, vol. 48, No. 3, Jun. 2001.
C. Liu et al., "Advanced Algorithm for MPPT Control of Photovoltaic Systems", Canadian Solar Buildings Conference, Montreal, Aug. 20-24, 2004.
Chihchiang Hua and Chihming Shen, "Study of Maximum Power Tracking Techniques and Control of DC/DC Converters for Photovoltaic Power System", IEEE 1998.
Tore Skjellnes et al., "Load sharing for parallel inverters without communication", Nordic Workshop in Power and Industrial Electronics, Aug. 12-14, 2002.
Giorgio Spiazzi at el., "A New Family of Zero-Current-Switching Variable Frequency dc-dc Converters", IEEE 2000.
Nayar, C.V., M. Ashari and W.W.L Keerthiphala, "A Gridinteractive Photovoltaic Uninterruptible Power Supply System Using Battery Storage and a Back up Diesel Generator", IEEE Transactions on Energy Conversion, vol. 15, No. 3, Sep. 2000, pp. 348?353.
Ph. Strauss et al., "AC coupled PV Hybrid systems and Micro Grids-state of the art and future trends", 3rd World Conference on Photovoltaic Energy Conversion, Osaka, Japan May 11-18, 2003.
Nayar, C.V., abstract, Power Engineering Society Summer Meeting, 2000. IEEE, 2000, pp. 1280-1282 vol. 2.
D. C. Martins et al., "Analysis of Utility Interactive Photovoltaic Generation System using a Single Power Static Inverter", Asian J. Energy Environ., vol. 5, Issue 2, (2004), pp. 115-137.
Rafael C. Beltrame et al., "Decentralized Multi String PV System With Integrated ZVT Cell", Congresso Brasileiro de Automática / 12 a Sep. 16, 2010, Bonito-MS.
Sergio Busquets-Monge et al., "Multilevel Diode-clamped Converter for Photovoltaic Generators With Independent Voltage Control of Each Solar Array", IEEE Transactions on Industrial Electronics, vol. 55, No. 7, Jul. 2008.
Soeren Baekhoej Kjaer et al., "A Review of Single-Phase Grid-Connected Inverters for Photovoltaic Modules", IEEE Transactions on Industry Applications, vol. 41, No. 5, Sep./Oct. 2005.
Office Action—JP 2011-539491—Mailing date: Mar. 26, 2013.
Supplementary European Search Report—EP08857456—Mailing Date Dec. 6, 2013.
Extended European Search Report—EP14151651.8—Mailing date: Feb. 25, 2014.
Iyomori H et al: "Three-phase bridge power block module type auxiliary resonant AC link snubber-assisted soft switching inverter for distributed AC power supply", INTELEC 2003. 25th. International Telecommunications Energy Conference. Yokohama, Japan, Oct. 19-23, 2003; Tokyo, IEICE, JP, Oct. 23, 2003 (Oct. 23, 2003), pp. 650-656, XP031895550, ISBN: 978-4-88552-196-6.
Yuqing Tang: "High Power Inverter EMI characterization and Improvement Using Auxiliary Resonant Snubber Inverter", Dec. 17, 1998 (Dec. 17, 1998), XP055055241, Blacksburg, Virginia

(56) References Cited

OTHER PUBLICATIONS

Retrieved from the Internet: URL:http:jjscholar.lib.vt.edu/theses/available/etd-012299-165108/unrestricted/THESIS.PDF, [retrieved on Mar. 5, 2013].
Yoshida M et al: "Actual efficiency and electromagnetic noises evaluations of a single inductor resonant AC link snubber-assisted three-phase soft-switching inverter", INTELEC 2003. 25th. International Telecommunications Energy Conference. Yokohama, Japan, Oct. 19-23, 2003; Tokyo, IEICE, JP, Oct. 23, 2003 (Oct. 23, 2003), pp. 721-726, XP031895560, ISBN: 978-4-88552-196-6.
Third party observation—EP07874025.5—Mailing date: Aug. 6, 2011.
Extended European Search Report—EP 13152967.9—Mailing date: Aug. 28, 2014.
Extended European Search Report—EP 14159696—Mailing Date: Jun. 20, 2014.
Gow Ja A et al: "A Modular DC-DC Converter and Maximum Power Tracking Controller Formedium to Large Scale Photovoltaic Generating Plant"8th European Conference on Power Electronics and Applications. Lausaane, CH, Sep. 7-9, 1999, EPE. European Conference on Power Electronics and Applications, Brussls: EPE Association, BE, vol. Conf. 8, Sep. 7, 1999, pp. 1-8, XP000883026.
Chihchiang Hua et al: "Comparative Study of Peak Power Tracking Techniques for Solar Storage System" Applied Power Electronics Conference and Exposition, 1998. APEC '98. Conference Proceedings 1998, Thirteenth Annual Anaheim, CA USA Feb. 15-19, 1998, New York, NY, USA, IEEE, US, Feb. 15, 1998, pp. 679-685, XP010263666.
Matsuo H et al: "Novel Solar Cell Power Supply System Using the Miltiple-input DC-DC Converter" 20th International telecommunications Energy Conference. Intelec '98 San Francisco, CA, Oct. 4-8, 1998, Intelec International Telecommunications Energy Conference, New York, NY: IEEE, US, Oct. 4, 1998, pp. 797-802, XP000896384.
Chihchiang Hua et al: "DSP-based controller application in battery storage of photovoltaic system" Industrial Electronics, Control, and Instrumentation, 1996, Proceedings of the 1996 IEEE IECON 22nd International Conference on Taipei, Taiwan Aug. 5-10, 1996, New York, NY, USA, IEEE, US, Aug. 5, 1996, pp. 1705-1710, XP010203239.
Hua C et al: "Implementation of a DSP-Controlled Photovoltaic System with Peak Power Tracking" IEEE Transactions on industrial Electronics, IEEE, Inc. New York, US, vol. 45, No. 1, Feb. 1, 1998, pp. 99-107, XP000735209.
I. Weiss et al.: "A new PV system technology—the development of a magnetic power transmission from the PV module to the power bus" 16th European Photovoltaic Solar Energy Conference, vol. III, May 1-5, 2000, pp. 2096-2099, XP002193468 Glasgow,UK.
Basso, Tim, "IEEE Standard for Interconnecting Distributed Resources With the Electric Power System," IEEE PES Meeting, Jun. 9, 2004.
Boostbuck.com, "The Four Boostbuck Topologies," located at http://www.boostbuck.com/TheFourTopologies.html, 2003.
Gautam, Nalin K. et al., "An Efficient Algorithm to Simulate the Electrical Performance of Solar Photovoltaic Arrays," Energy, vol. 27, No. 4, pp. 347-361, 2002.
Nordmann, T. et al., "Performance of PV Systems Under Real Conditions," European Workshop on Life Cycle Analysis and Recycling of Solar Modules, The "Waste" Challenge, Brussels, Belgium, Mar. 18-19, 2004.
Wiles, John, "Photovoltaic Power Systems and the National Electrical Code: Suggested Practices," Sandia National Laboratories, document No. SAND2001-0674, Mar. 2001.
Hewes, J. "Relays," located at http://web.archive.org/web/20030816010159/www.kpsec.freeuk.com/components/relay.htm, Aug. 16, 2003.
Advanced Energy Group, "The Basics of Solar Power Systems," located at http://web.archive.org/web/20010331044156/http://www.solar4power.com/solar-power-basics.html, Mar. 31, 2001.

International Patent Application No. PCT/AU2005/001017, International Search Report and Written Opinion, Aug. 18, 2005.
Baek, Ju-Won et al., "High Boost Converter using Voltage Multiplier," 2005 IEEE Conference, IECON 05, pp. 567-572, Nov. 2005.
Wikimedia Foundation, Inc., "Electric Power Transmission," located at http://web.archive.org/web/20041210095723/en.wikipedia.org/wiki/Electric-power-transmission, Nov. 17, 2004.
Jacobsen, K.S., "Synchronized Discrete Multi-Tone (SDMT) Modulation for Cable Modems: Making the Most of the Scarce Reverse Channel Bandwidth," Conference Proceedings of Wescon/97, pp. 374-380, Nov. 4, 1997.
Loyola, L. et al., "A Multi-Channel Infrastructure based on DCF Access Mechanism for Wireless LAN Mesh Networks Compliant with IEEE 802.11," 2005 Asia-Pacific Conference on Communications, pp. 497-501, Oct. 5, 2005.
Storfer, Lior, "Enhancing Cable Modem TCP Performance," Texas Instruments Inc. white paper, Jul. 2003.
International Preliminary Report on Patentability Issued in corresponding international application No. PCT/US04/16868, filed May 27, 2004.
United Kingdom Intellectual Property Office, Combined Search and Examination Report Under Sections 17 and 18(3), GB1020862.7, dated Jun. 16, 2011.
QT Technical Application Papers, "ABB Circuit-Breakers for Direct current Applications", ABB SACE S.p.A., An ABB Group Company, L.V. Breakers, Via Baioni, 35, 24123 Bergamo-Italy, Tel.: +39 035.395.111—Telefax: +39 035.395.306-433, Sep. 2007.
Woyte, et al., "Mains Monitoring and Protection in a European Context", 17th European Photovoltaic Solar Energy Conference and Exhibition, Munich, Germany, Oct. 22-26, 2001, Achim, Woyte, et al., pp. 1-4.
"Implementation and testing of Anti-Islanding Algorithms for IEEE 929-2000 Compliance of Single Phase Photovoltaic Inverters", Raymond M. Hudson, Photovoltaic Specialists Conference, 2002. Conference Record of the Twenty-Ninth IEEE, May 19-24, 2002.
Fairchild Semiconductor, Application Note 9016, IGBT Basics 1, by K.S. OH Feb. 1, 2001.
"Disconnect Switches in Photovoltaic Applications", ABB, Inc., Low Voltage Control Products & Systems, 1206 Hatton Road, Wichita Falls, TX 86302, Phone 888-385-1221, 940-397-7000, Fax: 940-397-7085, 1SXU301197B0201, Nov. 2009.
Walker, "A DC Circuit Breaker for an Electric Vehicle Battery Pack", Australasian Universities Power Engineering Conference and IEAust Electric Energy Conference, Sep. 26-29, 1999.
Combined Search and Examination Report for GB1018872.0 dated Apr. 15, 2011, 2 pages.
International Search Report and Opinion of International Patent Application PCT/2009/051221, dated Oct. 19, 2009.
International Search Report and Opinion of International Patent Application PCT/2009/051222, dated Oct. 7, 2009.
Communication in EP07874025.5 dated Aug. 17, 2011.
IPRP for PCT/IB2008/055095 dated Jun. 8, 2010, with Written Opinion.
ISR for PCT/IB2008/055095 dated Apr. 30, 2009.
ISR for PCT/IL07/01064 dated Mar. 25, 2008.
IPRP for PCT/IB2007/004584 dated Jun. 10, 2009, with Written Opinion.
IPRP for PCT/IB2007/004591 dated Jul. 13, 2010, with Written Opinion.
IPRP for PCT/IB2007/004643 dated Jun. 10, 2009, with Written Opinion.
Written Opinion for PCT/IB2008/055092 submitted with IPRP dated Jun. 8, 2010.
IPRP for PCT/US2008/085754 dated Jun. 8, 2010, with Written Opinion dated Jan. 21, 2009.
IPRP for PCT/US2008/085755 dated Jun. 8, 2010, with Written Opinion dated Jan. 20, 2009.
IPRP for PCT/IB2009/051221 dated Sep. 28, 2010, with Written Opinion.
IPRP for PCT/IB2009/051222 dated Sep. 28, 2010, with Written Opinion.
IPRP for PCT/IB2009/051831 dated Nov. 9, 2010, with Written Opinion.

(56) References Cited

OTHER PUBLICATIONS

IPRP for PCT/US2008/085736 dated Jun. 7, 2011, with Written Opinion.
IPRP for PCT/IB2010/052287 dated Nov. 22, 2011, with Written Opinion.
ISR for PCT/IB2010/052413 dated Sep. 7, 2010.
UK Intellectual Property Office, Application No. GB1109618.7, Patents Act 1977, Examination Report Under Section 18(3), Sep. 16, 2011.
UK Intellectual Property Office, Patents Act 1977: Patents Rules Notification of Grant: Patent Serial No. GB2480015, Nov. 29, 2011.
Walker, et al. "PV String Per-Module Maximum Power Point Enabling Converters", School of Information Technology and Electrical Engineering The University of Queensland, Sep. 28, 2003.
Walker, "Cascaded DC-DC Converter Connection of Photovoltaic Modules", 33rd Annual IEEE Power Electronics Specialists Conference. PESC 2002. Conference Proceedings. Cairns, Queensland, Australia, Jun. 23-27, 2002; [Annual Power Electronics Specialists Conference], New York, NY: IEEE US, vol. 1, Jun. 23, 2002, pp. 24-29, XP010596060 ISBN: 978-0-7803-7262-7, figure 1.
Baggio, "Quasi-ZVS Activity Auxiliary Commutation Circuit for Two Switches Forward Converter", 32nd Annual IEEE Power Electronics Specialists Conference. PESC 2001. Conference Proceedings. Vancouver, Canada, Jun. 17-21, 2001; [Annual Power Electronics Specialists Conference] New York, NY: IEEE, US.
Ilic, "Interleaved Zero-Current-Transition Buck Converter", IEEE Transactions on Industry Applications, IEEE Service Center, Piscataway, NJ, US, vol. 43, No. 6, Nov. 1, 2007, pp. 1619-1627, XP011197477 ISSN: 0093-9994, pp. 1619-1922.
Lee: "Novel Zero-Voltage-Transition and Zero-Current-Transition Pulse-Width-Modulation Converters", Power Electronics Specialists Conference, 1997, PESC '97, Record, 28th Annual IEEE St. Louis, MO, USA, Jun. 22-27, 1997, New York, NY, USA IEEE, US, vol. 1, Jun. 22, 1997, pp. 233-239, XP010241553, ISBN: 978-0-7803-3840-1, pp. 233-236.
Sakamoto, "Switched Snubber for High-Frequency Switching Converters", Electronics & Communications in Japan, Part 1—Communications, Wiley, Hoboken, NJ, US, vol. 76, No. 2, Feb. 1, 1993, pp. 30-38, XP000403018 ISSN: 8756-6621, pp. 30-35.
Duarte, "A Family of ZVX-PWM Active-Clamping DC-to-DC Converters: Synthesis, Analysis and Experimentation", Telecommunications Energy Conference, 1995, INTELEC '95, 17th International The Hague, Netherlands, Oct. 29-Nov. 1, 1995, New York, NY, US, IEEE, US, Oct. 29, 1995, pp. 502-509, XP010161283 ISBN: 978-0/7803-2750-4 p. 503-504.
IPRP for PCT/IL2007/001064 dated Mar. 17, 2009, with Written Opinion dated Mar. 25, 2008.
IPRP for PCT/IB2007/004586 dated Jun. 10, 2009, with Written Opinion.
Gao, et al., "Parallel-Connected Solar PV System to Address Partial and Rapidly Fluctuating Shadow Conditions", IEEE Transactions on Industrial Electronics, vol. 56, No. 5, May 2009, pp. 1548-1556.
IPRP PCT/IB2007/004610—date of issue Jun. 10, 2009.
Extended European Search Report—EP12176089.6—Mailing date: Nov. 8, 2012.
Gwon-Jong Yu et al: "Maximum power point tracking with temperature compensation of photovoltaic for air conditioning system with fuzzy controller", May 13,1996; May 13, 1999-May 17, 1996, May 13, 1996 (May 13, 1996), pp. 1429-1432, XP010208423.
Extended European Search Report—EP12177067.1—Mailing Date: Dec. 7, 2012.
GB Combined Search and Examination Report—GB1200423.0—Mailing date: Apr. 30, 2012.
GB Combined Search and Examination Report—GB1201499.9—Mailing date: May 28, 2012.
"Study of Energy Storage Capacitor Reduction for Single Phase PWM Rectifier", Ruxi Wang et al., Virginia Polytechnic Institute and State University, Feb. 2009.

"Multilevel Inverters: A Survey of Topologies, Controls, and Applications", José Rodríguez et al., IEEE Transactions on Industrial Electronics, vol. 49, No. 4, Aug. 2002.
Extended European Search Report—EP 08878650A—Mailing date: Mar. 28, 2013.
Satcon Solstice—Satcon Solstice 100 kW System Solution Sheet—2010.
John Xue, "PV Module Series String Balancing Converters", University of Queensland—School of Information Technology & Electrical Engineering, Nov. 6, 2002.
Robert W. Erickson, "Future of Power Electronics for Photovoltaics", IEEE Applied Power Electronics Conference, Feb. 2009.
GB Combined Search and Examination Report—GB1201506.1—Mailing date: May 22, 2012.
Ciobotaru, et al., Control of single-stage single-phase PV inverter, Aug. 7, 2006.
International Search Report and Written Opinion for PCT/IB2007/004591 dated Jul. 5, 2010.
European Communication for EP07873361.5 dated Jul. 12, 2010.
European Communication for EP07874022.2 dated Oct. 18, 2010.
European Communication for EP07875148.4 dated Oct. 18, 2010.
Chen, et al., "A New Low-Stress Buck-Boost Converter for Universal-Input PFC Applications", IEEE Applied Power Electronics Conference, Feb. 2001, Colorado Power Electronics Center Publications.
Chen, et al., "Buck-Boost PWM Converters Having Two Independently Controlled Switches", IEEE Power Electronics Specialists Conference, Jun. 2001, Colorado Power Electronics Center Publications.
Esram, et al., "Comparison of Photovoltaic Array Maximum Power Point Tracking Techniques", IEEE Transactions on Energy Conversion, vol. 22, No. 2, Jun. 2007, pp. 439-449.
Walker, et al., "Photovoltaic DC-DC Module Integrated Converter for Novel Cascaded and Bypass Grid Connection Topologies-Design and Optimisation", 37th IEEE Power Electronics Specialists Conference, Jun. 18-22, 2006, Jeju, Korea.
Geoffrey R. Walker Affidavit re: U.S. Appl. No. 11/950,307, submitted in an IDS for U.S. Appl. No. 11/950,271 on Mar. 9, 2010.
Geoffrey R. Walker Affidavit re: U.S. Appl. No. 11/950,271, submitted in an IDS for U.S. Appl. No. 11/950,271 on Mar. 9, 2010.
International Search Report for PCT/IB2007/004610 dated Feb. 23, 2009.
International Search Report for PCT/IB2007/004584 dated Jan. 28, 2009.
International Search Report for PCT/IB2007/004586 dated Mar. 5, 2009.
International Search Report for PCT/IB2007/004643 dated Jan. 30, 2009.
International Search Report for PCT/US2008/085736 dated Jan. 28, 2009.
International Search Report for PCT/US2008/085754 dated Feb. 9, 2009.
International Search Report for PCT/US2008/085755 dated Feb. 3, 2009.
Kajihara, et al., "Model of Photovoltaic Cell Circuits Under Partial Shading", 2005 IEEE, pp. 866-870.
Knaupp, et al., "Operation of a 10 KW PV Façade with 100 W AC Photovoltaic Modules", 1996 IEEE, 25th PVSC, May 13-17, 1996, pp. 1235-1238, Washington, DC.
Alonso, et al., "Cascaded H-Bridge Multilevel Converter for Grid Connected Photovoltaic Generators with Independent Maximum Power Point Tracking of Each Solar Array", 2003 IEEE 34th, Annual Power Electronics Specialists Conference, Acapulco, Mexico, Jun. 15-19, 2003, pp. 731-735, vol. 2.
Myrzik, et al., "String and Module Integrated Inverters for Single-Phase Grid Connected Photovoltaic Systems—A Review", Power Tech Conference Proceedings, 2003 IEEE Bologna, Jun. 23-26, 2003, p. 8, vol. 2.
Chen, et al., "Predictive Digital Current Programmed Control", IEEE Transactions on Power Electronics, vol. 18, Issue 1, Jan. 2003.

(56) References Cited

OTHER PUBLICATIONS

Wallace, et al., "DSP Controlled Buck/Boost Power Factor Correction for Telephony Rectifiers", Telecommunications Energy Conference 2001, INTELEC 2001, Twenty-Third International, Oct. 18, 2001, pp. 132-138.
Alonso, "A New Distributed Converter Interface for PV Panels", 20th European Photovoltaic Solar Energy Conference, Jun. 6-10, 2005, Barcelona, Spain, pp. 2288-2291.
Alonso, "Experimental Results of Intelligent PV Module for Grid-Connected PV Systems", 21st European Photovoltaic Solar Energy Conference, Sep. 4-8, 2006, Dresden, Germany, pp. 2297-2300.
Enslin, "Integrated Photovoltaic Maximum Power Point Tracking Converter", IEEE Transactions on Industrial Electronics, vol. 44, No. 6, Dec. 1997, pp. 769-773.
Lindgren, "Topology for Decentralised Solar Energy Inverters with a Low Voltage AC-Bus", Chalmers University of Technology, Department of Electrical Power Engineering, EPE '99—Lausanne.
Nikraz, "Digital Control of a Voltage Source Inverter in a Photovoltaic Applications", 2004 35th Annual IEEE Power Electronics Specialists Conference, Aachen, Germany, 2004, pp. 3266-3271.
Orduz, "Evaluation Test Results of a New Distributed MPPT Converter", 22nd European Photovoltaic Solar Energy Conference, Sep. 3-7, 2007, Milan, Italy.
Palma, "A Modular Fuel Cell, Modular DC-DC Converter Concept for High Performance and Enhanced Reliability", IEEE 2007, pp. 2633-2638.
Quaschning, "Cost Effectiveness of Shadow Tolerant Photovoltaic Systems", Berlin University of Technology, Institute of Electrical Energy Technology, Renewable Energy Section. EuroSun '96, pp. 819-824.
Roman, "Intelligent PV Module for Grid-Connected PV Systems", IEEE Transactions on Industrial Electronics, vol. 52, No. 4, Aug. 2006, pp. 1066-1073.
Roman, "Power Line Communications in Modular PV Systems", 20th European Photovoltaic Solar Energy Conference, Jun. 6-10, 2005, Barcelona, Spain, pp. 2249-2252.
Uriarte, "Energy Integrated Management System for PV Applications", 20th European Photovoltaic Solar Energy Conference, Jun. 6-10, 2005, Barcelona, Spain, pp. 2292-2295.
Walker, "Cascaded DC-DC Converter Connection of Photovoltaic Modules", IEEE Transactions on Power Electronics, vol. 19, No. 4, Jul. 2004, pp. 1130-1139.
Matsui, et al., "A New Maximum Photovoltaic Power Tracking Control Scheme Based on Power Equilibrium at DC Link", IEEE, 1999, pp. 804-809.
Hou, et al., Application of Adaptive Algorithm of Solar Cell Battery Charger, Apr. 2004.
Stamenic, et al., "Maximum Power Point Tracking for Building Integrated Photovoltaic Ventilation Systems", 2000.
International Preliminary Report on Patentability for PCT/IB2008/055092 dated Jun. 8, 2010.
International Search Report for PCT/IB2008/055092 dated Sep. 8, 2009.
International Search Report and Opinion of International Patent Application WO2009136358 (PCT/IB2009/051831), dated Sep. 16, 2009.
Informal Comments to the International Search Report dated Dec. 3, 2009.
PCT/IB2010/052287 International Search Report and Written Opinion dated Sep. 2, 2010.
UK Intellectual Property office, Combined Search and Examination Report for GB1100450.4 under Sections 17 and 18 (3), Jul. 14, 2011.
Jain, et al., "A Single-Stage Grid Connected Inverter Topology for Solar PV Systems with Maximum Power Point Tracking", IEEE Transactions on Power Electronics, vol. 22, No. 5, Sep. 2007, pp. 1928-1940.
Lynch, et al., "Flexible DER Utility Interface System: Final Report", Sep. 2004-May 2006, Northern Power Systems, Inc., Waitsfield, Vermont B. Kroposki, et al., National Renewable Energy Laboratory Golden, Colorado Technical Report NREL/TP-560-39876, Aug. 2006.
Schimpf, et al., "Grid Connected Converters for Photovoltaic, State of the Art, Ideas for improvement of Transformerless Inverters", NORPIE/2008, Nordic Workshop on Power and Industrial Electronics, Jun. 9-11, 2008.
Sandia Report SAND96-2797 I UC-1290 Unlimited Release, Printed Dec. 1996, "Photovoltaic Power Systems and The National Electrical Code: Suggested Practices", by John Wiles, Southwest Technology Development Institute New Mexico State University Las Cruces, NM.
Chinese Office Action—CN 201510423458.2—mailed Jan. 3, 2017 (english translation provided).
Chinese Office Action—CN 201410098154.9—mailed Mar. 3, 2017 (enligsh translation provided).
European Search Report—EP Appl. 13150911.9—Apr. 7, 2017.
Chinese Office Action and Search Report—CN 201510578586.4—dated Apr. 19, 2017.
Jul. 13, 2017—Chinese Office Action—CN201210007491.3.
Jul. 31, 2014—Huimin Zhou et al.—"PV Balancers: Concept, Architectures, and Realization"—IEEE Transactions on Power Electronics, vol. 30, No. 7, pp. 3479-3487.
Sep. 15, 2012—Huimin Zhou et. al—"PV balancers: Concept, architectures, and realization"—Energy Conversion congress and Exposition (ECCE), 2012 IEEE, IEEE pp. 3749-3755.
Jul. 17, 2017—International Search Report—PCT/US20171031571.
Aug. 4, 2017—European Search Report—EP 17165027.
Chinese Office Action—CN Appl. 201280006369.2—dated Aug. 4, 2015.
Chinese Office Action—CN Appl. 201210007491.3—dated Nov. 23, 2015.
Chinese Office Action—CN App. 201310035221.8—dated Mar. 1, 2016.
Philippe Welter, et al. "Electricity at 32 kHz," Photon International, the Photovoltaic Magazine, Http://www.photon-magazine.com/archiv/articles.aspx?criteria=4&,HeftNr=0807&,Title=Elec . . . printed May 27, 2011).
Chinese Office Action—CN Appl. 201210007491.3—dated Apr. 25, 2016.
CN Office Action—CN Appl. 201310004123.8—dated May 5, 2016.
Chinese Office Action—CN Appl. 201310035221.8—dated Aug. 11, 2016.
Mang, Pei et al.—"Hardware Design Experiences in ZebraNet"—Department of Electrical Engineering, Princeton University—SenSys '04, Nov. 3-5, 2004.
Chinese Office Action—CN Appl. 201510111948.9—dated Sep. 14, 2016.
Sep. 28, 2017—European Office Action—EP 08857835.6.
Nov. 2, 2017—EP Search Report App No. 13157876.7.
Nov. 7, 2012—EP Search Report—App No. 17171489.2.

\* cited by examiner

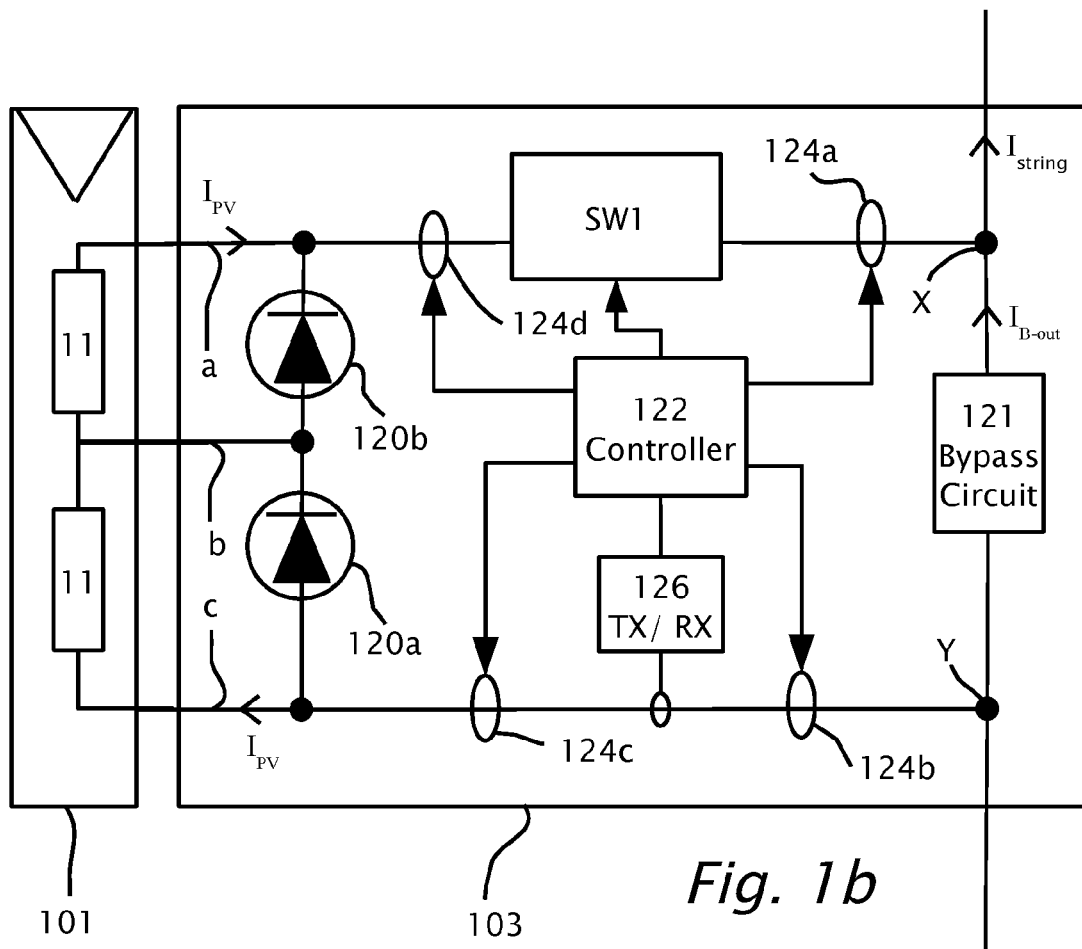
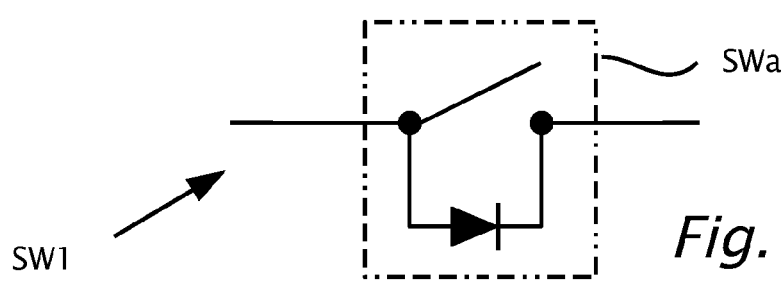
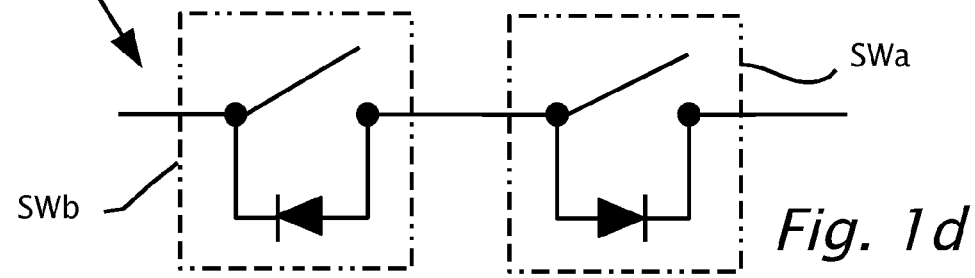

PHOTOVOLTAIC PANEL CIRCUITRY

CROSS-REFERENCE TO RELATED APPLICATIONS

This application is a continuation application of U.S. application Ser. No. 13/753,041, filed on Jan. 29, 2013, entitled "PHOTOVOLTAIC PANEL CIRCUITRY." This application claims priority to United Kingdom Application GB1201506.1 filed Jan. 30, 2012. Benefit of the filing date of this prior application is hereby claimed. The contents of all of these applications are hereby incorporated by reference in their entireties for all purposes.

BACKGROUND

1. Technical Field

Aspects of the present disclosure relate to distributed power systems, particularly a circuit for integrating with or attaching to a photovoltaic panel.

2. Description of Related Art

A conventional photovoltaic distributed power harvesting system multiple photovoltaic panels are interconnected and connected to an inverter. Various environmental and operational conditions impact the power output of the photovoltaic panels. For example, the solar energy incident, ambient temperature and other factors impact the power extracted from each photovoltaic panel. Dependent on the number and type of panels used, the extracted power may vary widely in the voltage and current from panel to panel. Changes in temperature, solar irradiance and shading, either from near objects such as trees or far objects such as clouds, can cause power losses. Owners and even professional installers may find it difficult to verify the correct operation of the system. With time, many more factors, such as aging, dust and dirt collection and panel degradation affect the performance of the solar photovoltaic distributed power system.

Data collected at the inverter may not be sufficient to provide proper monitoring of the operation of the system. Moreover, when the system experiences power loss, it is desirable to ascertain whether it is due to environmental conditions or from malfunctions and/or poor maintenance of the components of the solar power distributed power system. Furthermore, it is desirable to easily locate any particular solar panel that may be responsible for power loss. However, information collection from each panel requires a means of communication to a central data gathering system. It is desirable to control data transmission, to avoid transmission collisions, and ascertain each sender of data. Such a requirement can be most easily accomplished using a duplex transmission method. However, a duplex transmission method requires additional transmission lines and complicates the system. On the other hand, one-way transmission may be prone to collisions and makes it difficult to compare data transmitted from the various sources. Due to the wide variability of power output of such systems, and the wide range of environmental conditions that affect the power output, the output parameters from the overall system may not be sufficient to verify whether the solar array is operating at peak power production. Local disturbances, such as faulty installation, improper maintenance, reliability issues and obstructions might cause local power losses which may be difficult to detect from overall monitoring parameters.

Electric arcing can have detrimental effects on electric power distribution systems and electronic equipment. Arcing may occur in switches, circuit breakers, relay contacts, fuses and poor cable terminations. When a circuit is switched off or a bad connection occurs in a connector, an arc discharge may form across the contacts of the connector. An arc discharge is an electrical breakdown of a gas which produces an ongoing plasma discharge, resulting from a current flowing through a medium such as air which is normally non-conducting. At the beginning of a disconnection, the separation distance between the two contacts is very small. As a result, the voltage across the air gap between the contacts produces a very large electrical field in terms of volts per millimeter. This large electrical field causes the ignition of an electrical arc between the two sides of the disconnection. If a circuit has enough current and voltage to sustain an arc, the arc can cause damage to equipment such as melting of conductors, destruction of insulation, and fire. The zero crossing of alternating current (AC) power systems may cause an arc not to reignite. A direct current system may be more prone to arcing than AC systems because of the absence of zero crossing in DC power systems.

In Photovoltaic Power Systems and The National Electrical Code, Suggested Practices: Article 690-18 requires that a mechanism be provided to disable portions of the PV array or the entire PV array. Ground-fault detection, interruption, and array disablement devices might, depending on the particular design, accomplish the following actions; sense ground-fault currents exceeding a specified value, interrupt or significantly reduce the fault currents, open the circuit between the array and the load, short the array or sub-array According to the IEE wiring regulations (BS 7671:2008) a residual current device (RCD) class II device on the direct current (DC) photovoltaic side for disconnection because of ground-fault current is referred to in regulation 712.412.

The use of photovoltaic panel based power generation systems are attractive from an environmental point of view. However, the cost of photovoltaic panels and their relative ease of theft, might limit their adoption for use in power generation systems.

Thus there is a need for and it would be advantageous to have circuitry integrable or integrated with a photovoltaic panel which provides features including: monitoring of the photovoltaic panel, ground-fault detection and elimination, arc detection and elimination, theft prevention and a safety mode of operation while maintaining a minimal number of components in the circuit to decrease cost and increase reliability.

BRIEF SUMMARY

Various circuits are disclosed which are integrated or integrable with a photovoltaic panel to provide built-in functionality to the photovoltaic panel including safety features such as arc detection and elimination, ground fault detection and elimination, reverse current protection, monitoring of the performance of the photovoltaic panel, transmission of the monitored parameters and theft prevention of the photovoltaic panel. The circuits may avoid power conversion, for instance DC/DC power conversion, may avoid performing maximum power tracking to include a minimum number of components and thereby increase overall reliability.

According to features of the present invention, there is provided a circuit for a photovoltaic panel. The circuit may include an input terminal attachable to the photovoltaic panel, an output terminal and a controller. A switch may be operatively connected between the input terminal and the output terminal and a control terminal operatively connected to the controller. The switch when closed may provide a low impedance direct current path for direct current producible by the photovoltaic panel to the output terminal. The circuit may include multiple input terminals and multiple output terminals, high voltage input and output terminals and low voltage input and output terminals which may or may not be at ground potential. The circuit may further include an output bypass circuit connectible across the output terminals. The bypass circuit may be operable to bypass current around the switch and around the photovoltaic panel. The circuit may avoid power, voltage and current conversion between the input terminal and the output terminal. The circuit may further include at least one sensor operatively attached to the controller. The sensor may be configured to measure at least one parameter such as current through the input terminal, voltage at the input terminal, current through the output terminal or voltage at the input terminal. A transmitter may be operatively attached to the controller. The transmitter may be operable to transmit the at least one parameter. The circuit may further include a permanent attachment to the photovoltaic panel.

The circuit may include at least two modules or at least three modules operatively connected to or integrated with the controller selected from a theft detection module, an arc elimination module, a ground fault detection module and/or a safety module. The theft detection module may be operable to detect a potential theft of the photovoltaic panel by configuring the controller to activate the switch and to disconnect the photovoltaic panel from the output terminal(s) responsive to the potential theft detection.

The arc elimination module may be operable to detect an arc within or in the vicinity of the photovoltaic panel or the circuit. The controller may be configured to activate the switch and to disconnect the photovoltaic panel from the output terminal responsive to a detection of the arc. The ground fault detection module may be operable to detect a ground fault within the circuit or the photovoltaic panel. The controller may be configured to activate the switch and to disconnect the photovoltaic panel from the output terminal responsive to a detection of the ground fault. For the safety module, the controller may be configured to activate the switch to select either a safe operating mode to produce a safe limited output power on the output terminal or a normal operating mode to produce a substantially maximum output power from the photovoltaic panel.

The circuit may further include a monitoring module operable to monitor the performance of the photovoltaic panel. The monitoring module may be operable to detect at least one condition of over current, over voltage or over temperature. The controller may be configured to activate the switch responsive to the at least one condition.

According to features of the present invention, a circuit for a photovoltaic panel is provided. The circuit includes input terminals attachable to the photovoltaic panel, output terminals and a controller. A switch may be operatively connected between an input terminal and an output terminal. The switch may include a control terminal operatively connected to the controller. The switch may include a single pole switch with a first pole connected to at least one of the input terminals, a second pole connected to at least one of the output terminals and a control terminal operatively connected to the controller. The circuit may further include an input bypass circuit connectible across the input terminals. The bypass circuit is operable to bypass current around the photovoltaic panel. The circuit may further include an output bypass circuit connectible across the output terminals. The bypass circuit may be operable to bypass current around the switch and around the photovoltaic panel. The switch when closed may provide a low impedance path for direct current between the photovoltaic panel to the output terminal.

The circuit may avoid power conversion between the input terminal and the output terminal. The circuit may also include a direct current (DC) to DC power converter to perform power conversion between the input terminal and the output terminal. The power converter may be a buck circuit, a boost circuit, a buck plus boost circuit, Cuk converter, or a buck-boost circuit.

The circuit may include at least two modules or at least three modules may be operatively connected or integrated with the controller including a monitoring module, a theft detection module, an arc elimination module and/or a ground fault detection module. The monitoring module may be operable to monitor the performance of the photovoltaic panel. The monitoring module may be operable to detect at least one condition such as over rated current, under rated current, over rated voltage, under rated voltage over rated temperature or under rated temperature. The controller may be configured to activate the switch responsive to the at least one condition. The monitoring module may be operable to monitor performance of the circuit. The theft detection module may be operable to detect a potential theft of the photovoltaic panel. The controller may be configured to activate the switch and to disconnect the photovoltaic panel from the output terminal responsive to the potential theft detection. The arc elimination module may be operable to detect arcing within or in the vicinity of the photovoltaic panel. The controller is configured to activate the switch and to disconnect the photovoltaic panel from the output terminal responsive to an arc detection. The ground fault detection module may be operable to detect a ground fault within the junction box or in the vicinity of the photovoltaic panel. The controller is configured to activate the switch and to disconnect the photovoltaic panel from the output terminal responsive to a ground fault detection.

The circuit may further include a safety module operatively connected to the controller. The controller may be configured to activate the switch to select either a safe operating mode to produce a safe working output power on the output terminal or a normal operating mode to produce a substantially maximum output power.

According to features of the present invention, there is provided a method performable in a photovoltaic solar power harvesting system. The method performs by a circuit integrated or integrable with a photovoltaic panel to form a photovoltaic module. The circuit has input terminals and output terminals. The circuit may include a controller adapted to monitor in parallel multiple types of malfunctions. The controller is adapted to control at least one switch connected between the input terminals and the output terminals to activate the switch and to disconnect thereby the photovoltaic panel from at least one of the output terminals and to bypass the output terminals upon detecting at least one of multiple malfunctions. The malfunctions monitored by the controller may include: an arc, a potential theft, a ground fault or a monitored parameter fault. The detection of the arc may be in the photovoltaic module or in the vicinity of the photovoltaic module. The disconnection of the photovoltaic panel from the at least one output terminal may be responsive to eliminate the arc. The potential theft of the photovoltaic module and the disconnection of the photovoltaic panel from the at least one output terminal may render the photovoltaic module inoperable outside the photovoltaic solar power harvesting system. The detection of a ground fault and in response the disconnection of the photovoltaic panel from the output terminal may eliminate the ground fault. The monitored parameter fault detected may be voltage, current and/or temperature. One or more of the monitored parameters may be out of a previously specified value range, the photovoltaic panel which not behaving according to specification is disconnected and the output terminals are bypassed.

BRIEF DESCRIPTION OF THE DRAWINGS

The invention is herein described, by way of example only, with reference to the accompanying drawings, wherein:

FIG. 1b shows more details of a circuit and a photovoltaic panel shown in FIG. 1a, according to an exemplary feature of the present invention.

FIGS. 1c and 1d show two exemplary switch circuits for a switch shown in FIG. 1b which are operable by a controller.

FIG. 3 shows a method for arc detection in a power harvesting system shown in FIG. 1a.

DETAILED DESCRIPTION

Figure 1A:
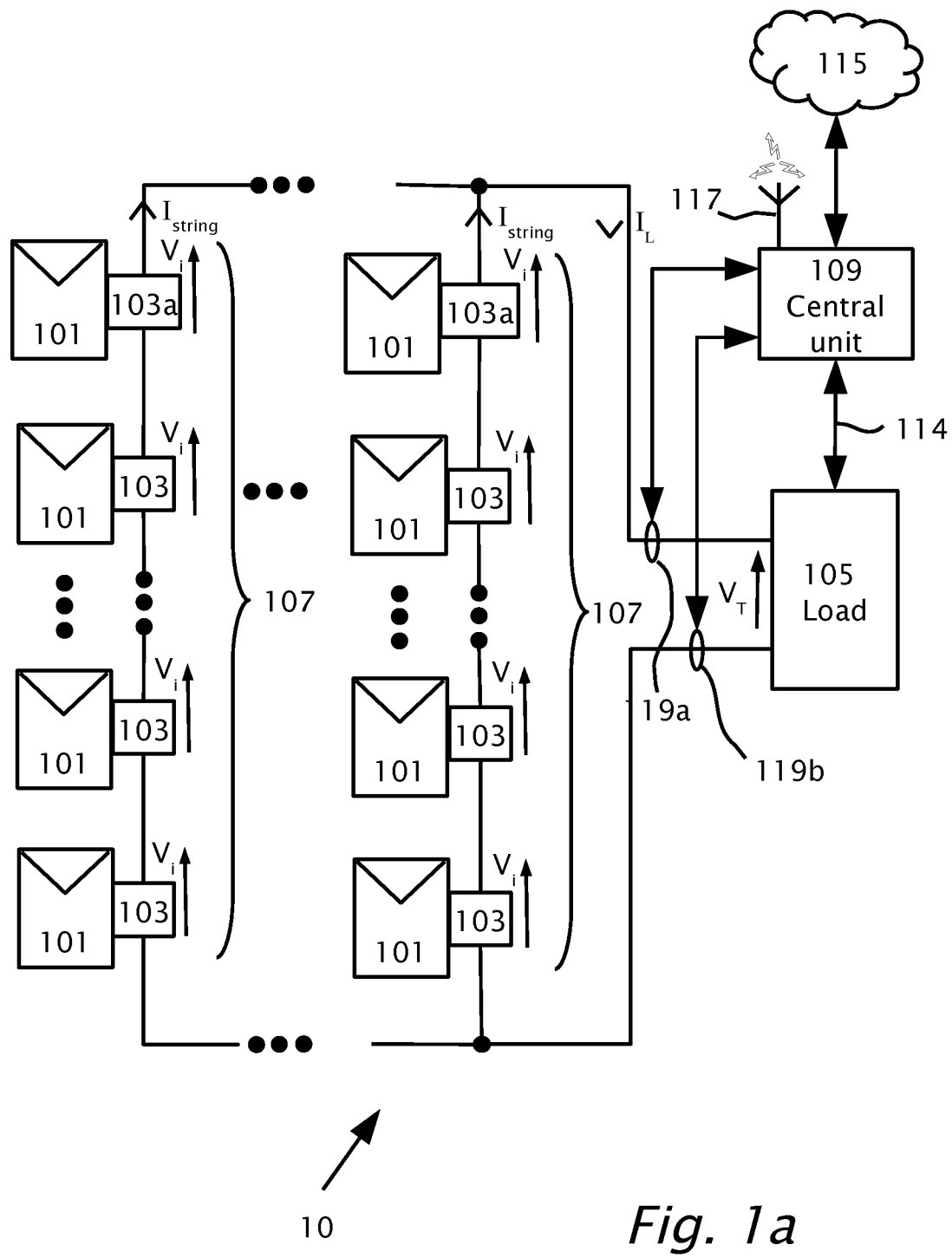
FIG. 1a illustrates a photovoltaic solar power harvesting system, illustrating features of the present invention.

Reference will now be made in detail to features of the present invention, examples of which are illustrated in the accompanying drawings, wherein like reference numerals refer to the like elements throughout. The features are described below to explain the present invention by referring to the figures.

Before explaining features of the invention in detail, it is to be understood that the invention is not limited in its application to the details of design and the arrangement of the components set forth in the following description or illustrated in the drawings. The invention is capable of other features or of being practiced or carried out in various ways. Also, it is to be understood that the phraseology and terminology employed herein is for the purpose of description and should not be regarded as limiting.

It should be noted, that although the discussion herein relates primarily to photovoltaic systems, the present invention may, by non-limiting example, alternatively be configured using other distributed power systems including (but not limited to) wind turbines, hydro turbines, fuel cells, storage systems such as battery, super-conducting flywheel, and capacitors, and mechanical devices including conventional and variable speed diesel engines, Stirling engines, gas turbines, and micro-turbines.

By way of introduction aspects of the present invention are directed to circuitry integrated or integrable with a photovoltaic panel to form a photovoltaic module. The circuitry may include multiple features for monitoring the performance of the photovoltaic panel, detection and elimination of arcs, and/or detection and elimination of ground faults in the photovoltaic module in or in the vicinity of the photovoltaic module or elsewhere in the photovoltaic power harvesting system. The circuitry may also include functionality for theft detection and prevention. The circuitry may also include functionality for providing both a safety mode of operation which features a current limited output and a normal mode of operation for production of solar power According to an exemplary feature of the present invention, the circuit is connected or connectible at the input terminals to a photovoltaic panel. The output terminals may be connected to form a string of photovoltaic modules. Multiple photovoltaic modules may be parallel connected to form the photovoltaic solar power harvesting system The term "vicinity" as used herein in the context or arc and/or ground fault detection may refer to another like photovoltaic module connected in series to form the serial string, another part of the serial string or another string, e.g. a neighboring photovoltaic string connected in parallel.

The term "current bypass" or "bypass" as used herein refers to a low-resistance direct current connection between the two input terminals and/or between two output terminals of the circuit to form an alternative path for direct current and/or power externally applied to the terminals. The bypass provides a current path for string current in the case the photovoltaic panel is disconnected by activation of the switch.

The term "passive" device as used herein, refers to the "passive" device not requiring external power from a source of power to perform a circuit function.

The term "active" device as used herein, refers to the "active" device which requires power from an external source of power to perform a circuit function.

The term "switch" as used herein refers to an active semiconductor switch, e.g. a field effect transistor (FET) in which a controllable and/or variable voltage or current is applied to a control terminal, e.g. gate, of the switch which determines the amount current flowing between the poles of the switch, e.g. source and drain of the FET.

The term "activate" a switch as used herein may refer to opening, closing and/or toggling i.e. alternatively opening and closing the switch.

Reference is also now made to FIG. 1a of a photovoltaic solar power harvesting system 10, illustrating aspects of the present invention. Power harvesting system 10 includes multiple photovoltaic panels 101 connected respectively to multiple circuits 103. Circuit 103 may be housed in a junction box to provide electrical terminations, mechanical support of bus bars a, b and c (not shown) which may be used as an input to circuit 103 from a panel 101. Alternatively, circuit 103 may be integrated with photovoltaic panel 101 without the use of a junction box. Circuit 103 may be attachable and/or re-attachable to panel 101 or may be permanently attachable to panel 101 using for example a thermoset adhesive, e.g. an epoxy adhesive. The electrical outputs of circuits 103 may be connected in series to form a series photovoltaic serial string 107 through which a string current ($I_{string}$) may flow. Multiple strings 107 may be connected in parallel and across an input of a load 105. Load 105 may be a direct current (DC) load such as a DC motor, a battery, an input to a DC to DC converter or a DC input to a DC to AC inverter.

A central unit 109 may be operationally connected by control line 114 to and located in the vicinity of load 105. Central unit 109 include a transmitter and/or receiving for transmitting and receiving power line communications (PLC) or wireless communications 117 to and from circuits

103. Current and/or voltage sensors 119a, 119b operatively attached to central unit 109 may sense the input of load 105 so as to measure input voltage ($V_T$) and input current ($I_L$) to load 105. Central unit 109 may also be operatively attached to a network 115, e.g. Internet for the purposes of remote monitoring or control of system 10. Central unit 109 may also serve as to send appropriate control signals to circuits 103 based on previously determined operating criteria of power harvesting system 10. Alternatively or in addition, a master circuit 103a in a string 107 may provide independent control within a string 107 and/or may work in conjunction with central unit 109.

Reference is now made to FIG. 1b which shows more details of circuit 103 and photovoltaic panel 101 shown in FIG. 1a, according to an exemplary feature. According to the example, photovoltaic panel 101 includes two sub-strings 11 of serially connected photovoltaic cells which output to bus bars a, b and c which are the input terminals to circuit 103. Circuit 103 may be housed in a junction box to provide electrical terminations, mechanical support of bus bars a, b and c and to provide the input terminals to circuit 103. The input of circuit 103 includes two bypass diodes 120a and 120b with anodes connected respectively to bus bars c and b and cathodes connected respectively to bus bars a and b. A transceiver 126 may also be operatively attached to controller 122. Transceiver 126 may provide power line communications (PLC) at node Y and/or node X. Transceiver 126 may alternatively provide wireless communications. A single pole switch SW1 connects serially between the cathode of diode 120a and node X. The control of switch SW1 is operatively attached to controller 122. Switch SW1 may be opened and closed by controller 122. A bypass circuit 121 is connected across nodes X and Y. Nodes X and Y provide connection of a circuit 103 into serial string 107. An alternative implementation of bypass circuit 121 shown in FIG. 1b, may have bypass diodes 120a and 120b replaced by two bypass circuits 121.

During normal operation of solar power harvesting system 10, panels 101 are irradiated by the Sun, panel 101 current ($I_{PV}$) is substantially equal to the string current ($I_{string}$), switch SW1 is closed and current ($I_{B-out}$) flowing through output bypass circuit 121 is substantially zero. The maximum string current ($I_{string}$) is normally limited by the worst performing panel 101 in a photovoltaic string 107 by virtue of Kirchhoff current law.

In a panel 101, if certain photovoltaic cells in sub-string 11 are shaded, the current passing through the shaded cells may be offered an alternative, parallel path through the inactive cells, and the integrity of the shaded cells may be preserved. The purpose of diodes 120a and 120b is to draw the current away from the shaded or damaged cells associated with diodes 120a and 120b in respective sub-strings 11. Bypass diodes 120a and 120b become forward biased when their associated shaded cells in one or more sub-strings 11 become reverse biased. Since the photovoltaic cells in a sub-string 11 and the associated bypass diodes 120a and 120b are in parallel, rather than forcing current through the shaded photovoltaic cells, the bypass diodes 120a and 120b bypass the current away from the shaded cells and maintains the connection to the next sub-string 11.

Controller 122 may be programmed under certain circumstances based on previously determined criteria, for instance based on current and voltage sensed on sensors 124a-124d, to open switch SW1, and thereby disconnect panel 101 from serial photovoltaic string 107. Bypass circuit 121 may be configured to provide a low impedance path such that the output bypass current ($I_{B-out}$) of bypass circuit 121 is substantially equal to string 107 current ($I_{string}$). Bypass circuit 121 allows disconnection of photovoltaic panel 101 from photovoltaic string 107 while maintaining current flow and power production from the remaining photovoltaic panels 101 of photovoltaic string 107.

Reference is now made to FIGS. 1c and 1d which show two variant switch circuits controllable by controller 122 for switch SW1 shown in FIG. 1b. The first switch circuit switch SWa is a single pole switch or semiconductor switch, e.g. FET, with a diode connected in parallel across the single pole switch. Switch SWa may be connected serially between node X and the cathode of diode 120b with the anode of the diode of switch SWa connected to the cathode of diode 120b and the cathode of the switch diode to node X. When switch SWa is open circuit, current from panel 101 to node X may flow through the diode of switch SWa and any reverse current from node X may be blocked. A similar series arrangement for switch SW1 is shown in FIG. 1d where switch SWa is wired in series with another switch SWb.

Switch SW1 may alternatively or in addition be connected at the low voltage terminal between node Y and the anode of diode 120a. An alternative arrangement for switch SW1 may have switch SWa connected serially between node X and the cathode of diode 120b and to have another switch SWb connected serially between node Y and the anode of diode 120a. In this alternative, the diode of switch SWb has an anode connected to node Y and a cathode connected to the anode of diode 120a. In this alternative, when both switches SWa and SWb are open circuit, current from panel 101 to node X may flow through the diode of switch SWa and any reverse current from node X may be blocked. Similarly, current from node Y to panel 101 may flow through the diode of switch SWb and any reverse current from node Y may be blocked.

Figure 1E:
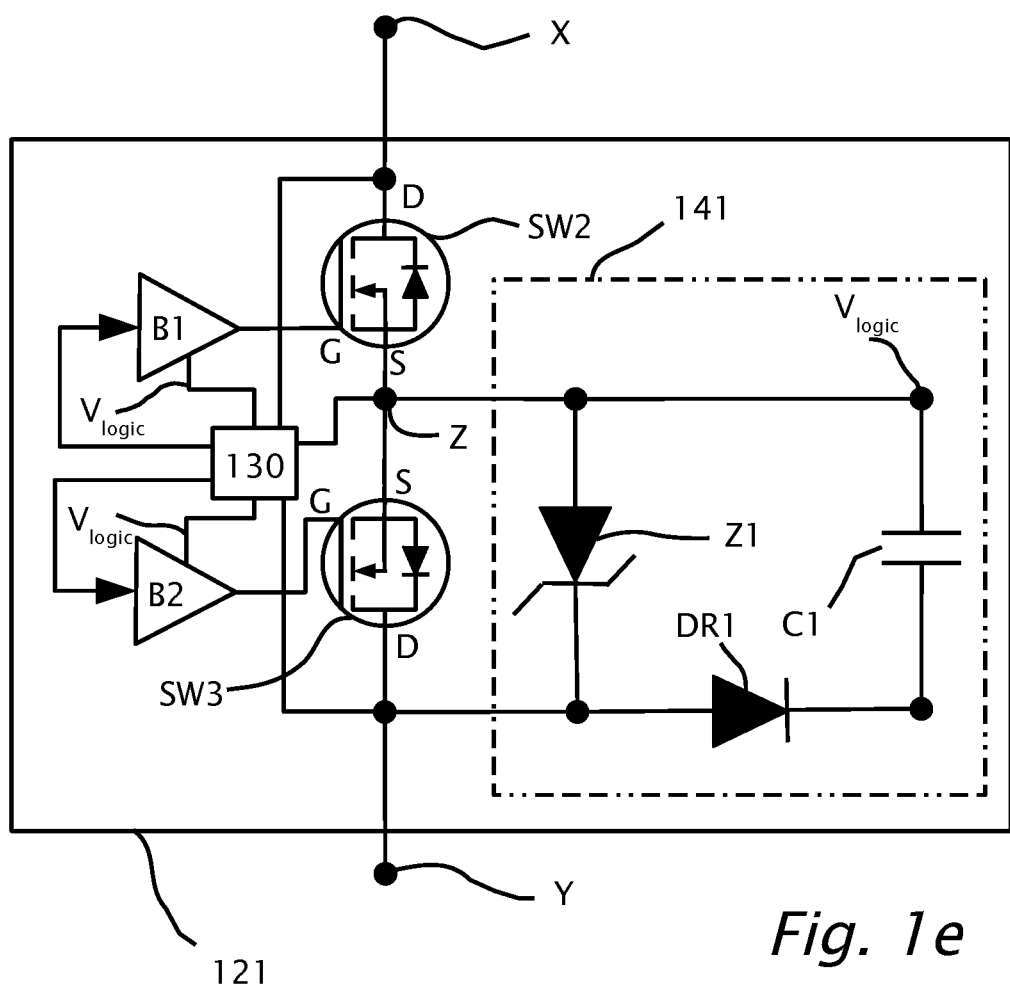
FIG. 1e shows more details of an active bypass circuit according to an exemplary feature of the present invention.

Reference is now made to FIG. 1e which shows more details of an active bypass circuit 121 according to an exemplary feature. Bypass circuit 121 includes switches SW2 and SW3 (operatively attached to a controller 130) and a charging circuit 141. Switches SW2 and SW3 in the example are implemented using metal oxide semiconductor field effect transistors (MOSFETs). Alternative solid state switches, e.g. bipolar transistors may be used for switches SW2 and SW3. The drain (D) of switch SW2 connects to node X. The source (S) of switch SW2 connects to the source (S) of switch SW3. An integral diode of switch SW2 has an anode connected to the source (S) of switch SW2 and a cathode connected to the drain (D) of switch SW2. The drain (D) of switch SW3 connects to node Y. Switch SW3 may have an integral diode with an anode connected to the source (S) of switch SW3 and a cathode connected to the drain (D) of switch SW3. Controller 130 connects to and senses node Z where the source of switch SW2 connects to the source (S) of switch SW3. Controller 130 connects to and senses node X and also connects to and senses node Y the drain (D) of switch SW3. Controller 130 also provides the direct current (DC) voltage ($V_{logic}$) required by buffer drivers B1 and B2. Buffer drivers B1 and B2 ensure sufficient power is available to turn switches SW2 and SW3 on and off. The outputs of buffer drivers B1 and B2 are connected to the gates (G) of switches SW2 and SW3 respectively. Buffer drivers B1 and B2 receive their respective logic inputs from controller 130. Charging circuit 141 has an input which connects to node Y and to node Z. Connected to node Z is the anode of a zener diode Z1. The cathode of zener diode Z1 connects to node Y. Zener diode Z1 may be alternatively implemented as a transient voltage suppression (TVS) diode. A charge storage device, e.g.

capacitor C1 has one end connected to the cathode of diode rectifier DR1 and the other end of charge storage device C1 connected to node Z. The anode of diode rectifier DR1 connects to node Y. Charge storage C1 device may be a capacitor, a battery or any device known in the art for storing electrical charge. The end of capacitor C1 connected to the cathode of diode rectifier DR1 provides the DC voltage ($V_{logic}$) to controller 130 and buffer drivers B1 and B2.

During the normal operation of power harvesting system 10 during which panels 101 are irradiated, the output of a circuit 103 need not be bypassed by bypass circuit 121. Bypass circuit 121 does not bypass by virtue of switches SW2 and SW3 both being off (open). Switches SW2 and SW3 both being off means substantially no current between respective drains and sources of switches SW2 and SW3 because the respective gates (G) of switches SW2 and SW3 are not been driven by buffer drivers B1 and B2.

By virtue of the analog inputs of controller 130 to the source (S) and drain (D) of switches SW2 and SW3 respectively and the source (S) of switch SW3, controller 130 is able to sense if an open circuit or a reverse voltage polarity exists across nodes X and Y. The open circuit sensed on nodes X and Y may indicate that switch SW1 is open and/or a sub-string 11 is open circuit. The reverse polarity across nodes X and Y may indicate that a panel 101 is shaded or faulty or that the panel 101 is operating as a sink of current rather than as a source of current.

The open circuit and/or the reverse polarity across nodes X and Y may cause bypass circuit 121 to operate in a bypass mode of operation. The bypass mode of operation of bypass circuit 121 may be when a panel 101 is partially shaded. The bypass mode of operation of circuit 121 may also be just before the normal operation when it still too dark to obtain a significant power output from panels 101, circuit 121 may have no power to work.

Figure 1F:
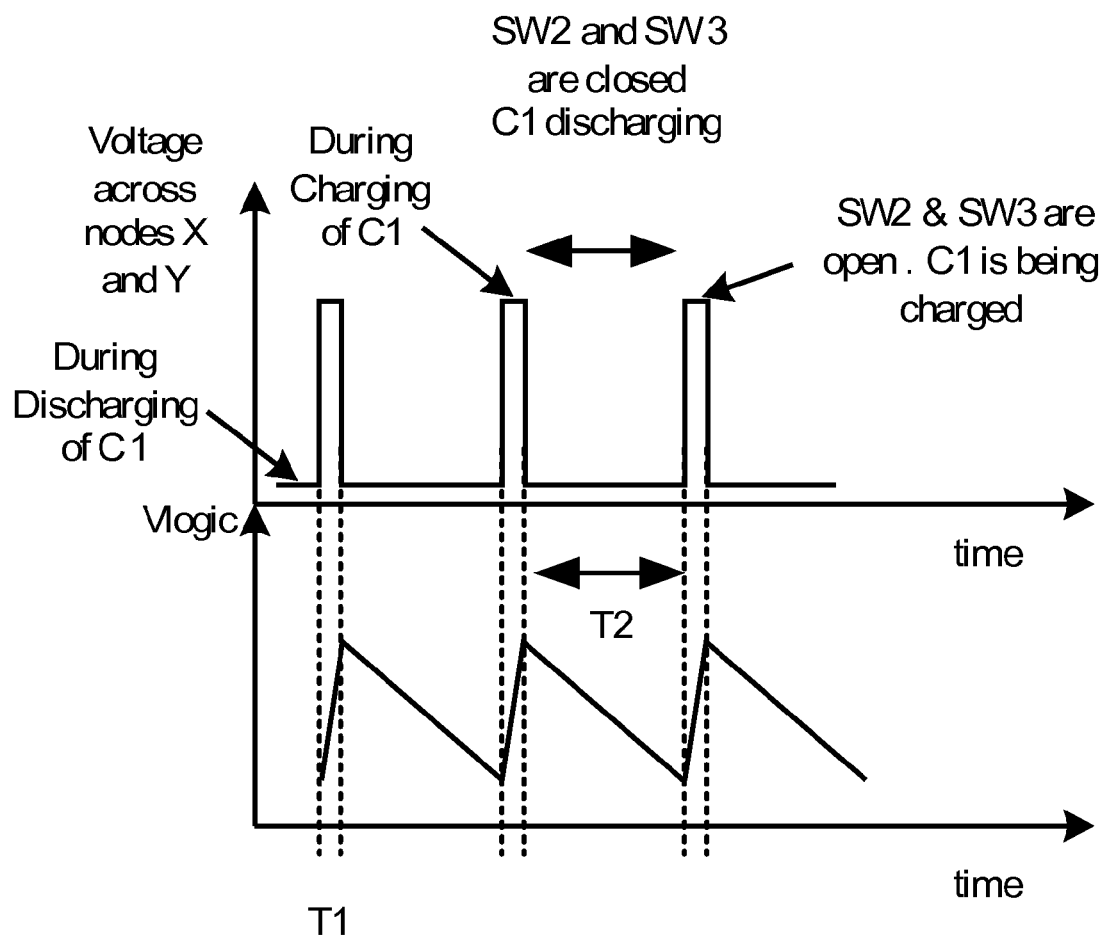
FIG. 1f shows a timing diagram of operation for the active bypass circuit shown in FIG. 1e.

Reference is now made to FIG. 1f which shows a timing diagram for circuit 121 operation. As soon as sufficient light irradiates panels 101 and current flows in photovoltaic string 107, zener diode Z1 has voltage drop VZ1 which charges capacitor C1 so as to provide $V_{logic}$ to controller 130. When capacitor C1 is being charged during time T1, the voltage drop of the output across nodes X and Y is the voltage (VZ1) of zener Z1 plus the voltage across the integral diode of switch SW2. When $V_{logic}$ is sufficient, all the active circuitry in controller 130 starts to work which closes switches SW2 and SW3 for a time period T2. Time period T2 may be much greater than time period T1. Switches SW2 and SW3 being closed (during time T2) gives a voltage drop across nodes X and Y. Therefore, with the longer time period T2 and the voltage drop across nodes X and Y, overall, less power may be lost by bypass circuit 121. Controller 130 continues to work until the voltage ($V_{logic}$) of charge storage device C1 drops below a minimal voltage and once again charge storage device C1 has voltage drop VZ1 from zener Z1 which charges capacitor C1 so as to provide $V_{logic}$. Once sufficient power is generated from panels 101, controller 130 can get a voltage supply from a panel 101 at nodes X and Y. Controller 130 may also further receive an external enable in order to work in synchronization with all the other bypass circuits 121 in a photovoltaic string 107.

During the bypass mode, controller 130 is able to sense on nodes X and Y if a panel 101 is functioning again and so controller 130 removes the bypass. The bypass across nodes X and Y is removed by turning switches SW2 and SW3 off.

Figure 1G:
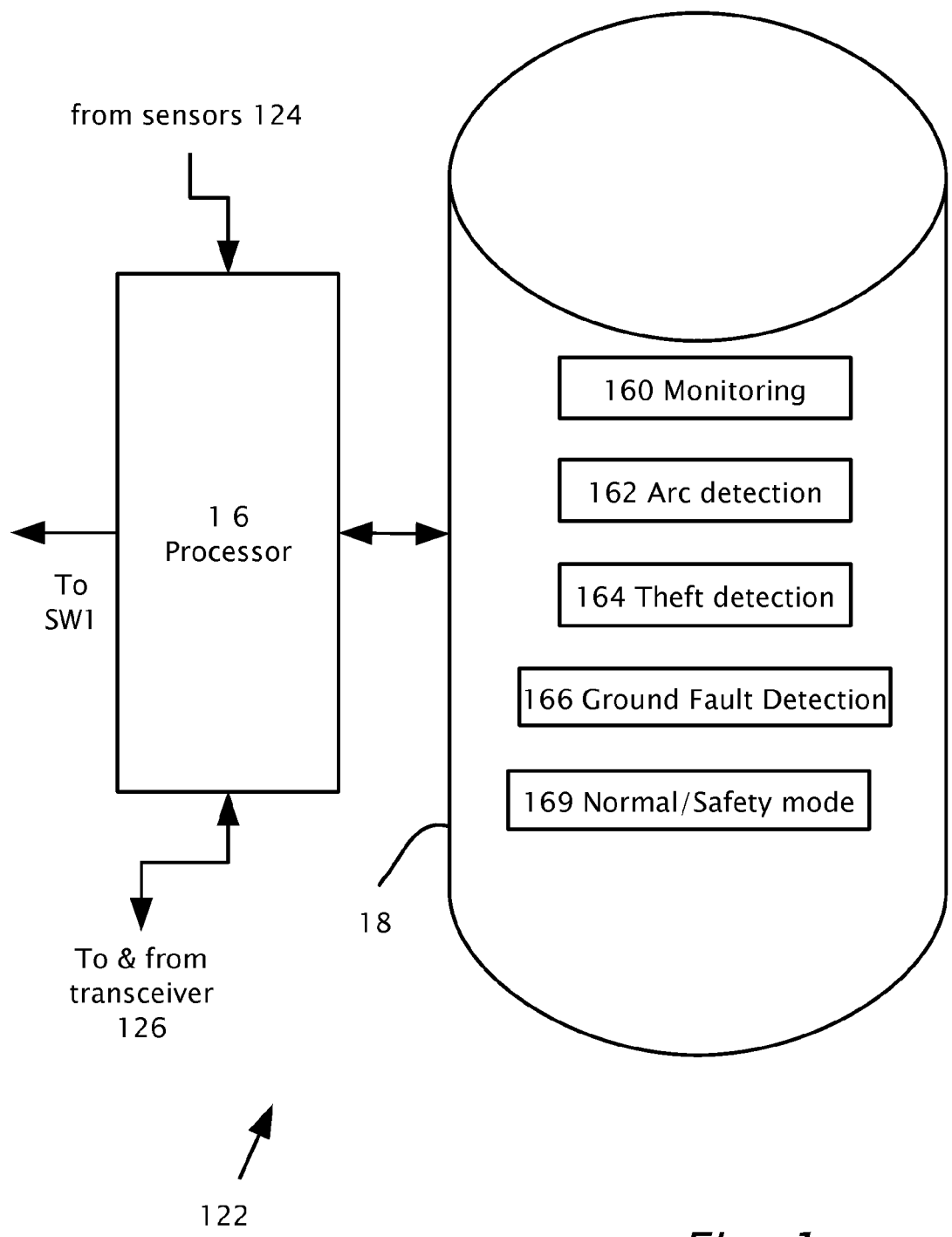
FIG. 1g shows an example of system level diagram of a controller and modules which may be implemented in the circuit of FIG. 1b.

Reference now made to FIG. 1g which shows an example of a system level diagram of a controller 122 which may be implemented in a circuit 103. Controller 122 includes a processor 16 which may be operatively attached to transceiver 126, switch SW1, sensors 124a-124d and storage 18. Storage 18 may include software modules and/or additional circuitry may provide functionality such as: for monitoring performance of the photovoltaic panel 160, ground fault detection 166, safety/normal mode operation 169, arc detection and elimination 162, theft detection and prevention 164. Circuit 103 may be configured to avoid power conversion, e.g. DC to DC conversion during normal power production. Circuit 103 may be configured to avoid maximum power point tracking of photovoltaic panel 101. In some configurations, switch SW1 may be a single switch, e.g. FET and therefore extra components, e.g. FET switches may be avoided.

160 Monitoring Performance and Control of Photovoltaic Panel 101 and Circuit 103

Monitoring performance of photovoltaic panels has been disclosed by the present inventors in US patent publication 2008/0147335. Monitoring may include monitoring input power at the input terminals (bus bars a,b,c) of circuit 103 and/or output power at output terminals nodes X and Y of circuit 103 by sensing current and voltage using sensors 124a-124d of circuit 103. Temperature sensors (not shown) may also be included in circuit 103 for measuring ambient temperature, temperature on the circuit board of circuit 103 and/or temperature of the photovoltaic panel 101. Monitoring results may be periodically or randomly transmitted to central unit 109 by communications over DC lines to inverter 105 or by wireless communication. Based on the monitoring results, if one or more sensed parameters are found out of rated specification, controller 122 may be programmed to activate, e.g. open switch SW1 and to disconnect photovoltaic panel 101 from photovoltaic string 107. Bypass circuit 121 autonomously bypasses string current around SW1 and photovoltaic panel 101.

DC power cables connecting load 105 to photovoltaic panel 101 and/or circuits 103 may provide a communication channel between central unit 109 and photovoltaic panels 101 As previously disclosed by the present inventors in co-pending patent application GB1100463.7, lengths of cables connecting load 105 to panels 101 or circuits 103 may be long and may contain one or several wire cores. The topography of a distributed power generation system to a large extent dictates the installation and placement of cable runs. Physical proximity of wires not having an electrical association may increase the chances of the wires in the cables being subject to the effects of noise if those wires are to be considered for signaling by DC power line communications. Crosstalk is a type of noise which refers to a phenomenon by which a signal transmitted on a cable, circuit or channel of a transmission system creates an undesired effect in another cable, circuit or channel. Crosstalk may be usually caused by undesired capacitive, inductive, or conductive coupling from one cable, circuit or channel, to another. Crosstalk may also corrupt the data being transmitted. Known methods of preventing the undesirable effects of crosstalk may be to utilize the shielding of cables, junction boxes, panels, inverters, loads or using twisted pair cables. Additionally, filtering techniques such as matched filters, decoupling capacitors or chokes may be used to prevent the undesirable effects of crosstalk. However, these ways of preventing the undesirable effects of crosstalk may be unavailable or impractical in a power generation system and/or may be prohibitively expensive in terms of additional materials and/or components required.

Within photovoltaic installation 10, a wire at positive potential and a wire at negative potential electrically associated therewith may be physically proximate thereto only at a point of connection to a piece of equipment. However, elsewhere in photovoltaic field 10, the wires may be separated and not be within the same cable run. In a photovoltaic power generation system, with power line communication over DC cables, it may be desirable to send a control signal or receive a monitoring signal between central unit 109 and circuit 103. Crosstalk may cause the other circuits 103 in power generation system 10 to inadvertently receive the control signal which is of course undesirable.

A method is disclosed, whereby signaling between a photovoltaic module 101/103 and a load 105 provides an association between the photovoltaic module 101/103 and the load 105. In an initial mode of operation, an initial code may be modulated to produce an initial signal. The initial signal may be transmitted by central unit 109 along DC line from load 105 to circuit 103. The initial signal may be received by circuit 103. The operating mode may be then changed to a normal mode of operation, and during the normal mode of operation a control signal may be transmitted central unit 109 along DC line from load 105 to circuit 103. A control code may be demodulated and received from the control signal. The control code may be compared with the initial code producing a comparison. The control command of the control signal may be validated as a valid control command associated with load 105 with the control command only acted upon when the comparison is a positive comparison.

166 Ground Fault Detection

As previously disclosed by the present inventors in copending application GB1020862.7, a device may be adapted for disconnecting at least one string carrying direct current power in multiple interconnected strings. Similarly, circuit 103 may include a differential current sensor adapted to measure a differential current by comparing respective currents in the positive lines (terminating at node X) and negative line (terminating at node Y). The differential current may be indicative of a ground fault in circuit 103 and/or photovoltaic panel 101. If a potential ground fault is detected, then SW1 and/or a similar switch in the negative line may be activated, e.g. opened. Bypass circuit 121 may autonomously bypass string current around SW1 and photovoltaic panel 101.

169 Safety/Normal Mode Operation

During normal mode operation of circuit 103, electrical power produced by photovoltaic panel 101 is provided to string 107. Maximum power point tracking may be provided at the input of load 105 for the interconnected strings so that in absence of shading or component failure most or all of photovoltaic panels contribute to the harvested power at or near the maximum power point. In conventional solar power harvesting systems, potential electric shock hazard may exist on the output terminals of the photovoltaic module 101/103. Consequently, during installation of a conventional system, photovoltaic panels may be covered to avoid light absorption by the photovoltaic panels and to prevent electrocution during installation.

A safety mode of operation may be provided by activating or toggling switch SW1, which may be a portion of a buck and/or boost converter in circuit 103 attached to a photovoltaic panel 101. Toggling switch SW1 at a known duty cycle may be used to force photovoltaic panel 101 far away from its maximum power point and the power output to string 107 may be forced to be very low avoiding other safety means such as covering photovoltaic panels during installation.

During the safety mode of operation, photovoltaic module 101/103 may be connected or disconnected and while being irradiated by the sun. Therefore, during the routine maintenance or installation of the power harvesting system 10, controller 122 of circuit 103 may be configured to open and close switch SW1 to produce a safe working output power on output terminals of the circuit 103. The safe working output power may be according to a predetermined duty cycle of switch SW1 opening and closing.

During the normal operation of the power harvesting system 10 when power harvesting system 10 is irradiated, it may be that photovoltaic module 101/103 is disconnected from a string 107 as a result of a malfunction or theft. In the case of theft it may well be desirable that a safe working output power on output terminals of the circuit 103 is produced so that a thief is not electrocuted for example.

164 Theft Detection

A number methods and/or devices for detection and/or theft prevention of photovoltaic panels are disclosed by the present applicant(s) in United States Patent Application 20100301991.

The use of codes is discussed above as a mechanism to avoid cross talk in monitoring and control signals carried over DC lines to central unit 109. Codes may be additionally used as a mechanism for theft detection and prevention. A first code is written in memory associated with load 105 and a second code is stored in the memory 18 located and operatively attached to circuit 103. The second code may be based on the first code or the second code may be a copy or a hash of the first code. The writing of the first code and/or the storing of the second code may be performed during installation of the power harvesting system. After the first code is read and stored in the first memory, and the second code is read and stored in memory 18, during the electrical power generation, the first code is compared with the second code or its hash. If the comparison is correct, (for instance the codes correspond) then power transfer from circuit 105 to string 107 is allowed, and switch SW1 is closed. Otherwise, if the codes do not match then switch SW1 is opened by controller 122. If circuit 105 is permanently attached or highly integrated with photovoltaic panel 101 then it will be difficult for the thief to benefit from the theft. Other methods for theft detection and/or protection as disclosed in international application PCT/IB2010/052413 may similar be used in conjunction with the present disclosure.

162 Arc Detection

Electric arcing can have detrimental effects on electric power distribution systems and electronic equipment. Arcing may occur in switches, circuit breakers, relay contacts, fuses and poor cable terminations. When a circuit is switched off or a bad connection occurs in a connector, an arc discharge may form across the contacts of the connector. An arc discharge is an electrical breakdown of a gas which produces an ongoing plasma discharge, resulting from a current flowing through a medium such as air which is normally non-conducting. At the beginning of a disconnection, the separation distance between the two contacts is very small. As a result, the voltage across the air gap between the contacts produces a very large electrical field in terms of volts per millimeter. This large electrical field causes the ignition of an electrical arc between the two sides of the disconnection. If a circuit has enough current and voltage to sustain an arc, the arc can cause damage to equipment such as melting of conductors, destruction of insulation, and fire.

Figure 3:
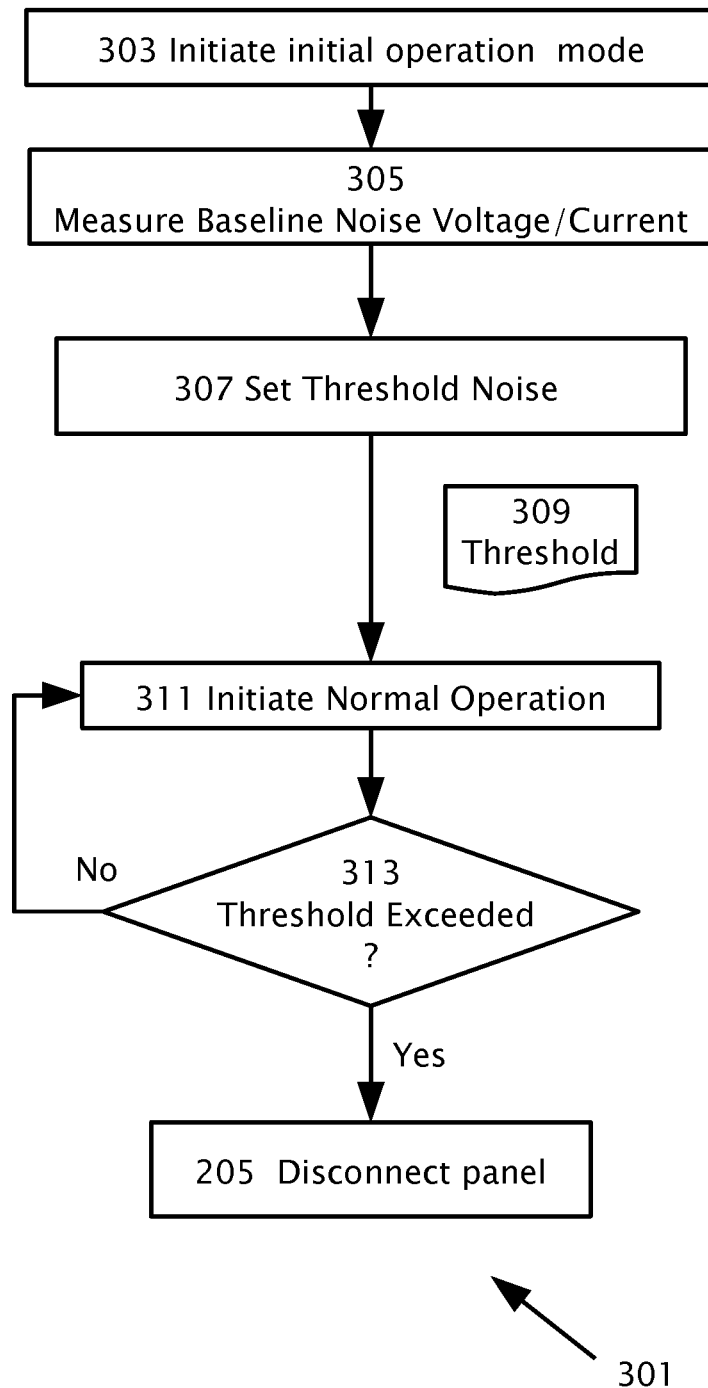

FIG. 3 shows a method 301 for arc detection in system 10 shown in FIG. 1*a*. In step 303 an initial mode of operation for system 10 is initiated. The initial mode may be when system 10 is first installed, when after installation on a daily basis panels 101 are illuminated at dawn or after a routine maintenance of system 10 where panels 101 may have been replaced or cables reconnected etc. The initial mode may also be initiated at various times during the day and times of the month. The initial mode initiated at various times during the day and times of the month may be performed in respect to the fact that the orientation of the sun varies throughout the year. The initial mode may take into account other factors such as temperature, cloud cover or accumulated dust deposition on the surfaces of a panels 101 for example.

In the initial mode, a baseline noise voltage or current may be measured (step 305) for a string 107 or a group of interconnected strings 107 as shown in system 10 and the overall noise voltage or current for system measured at load 105 via sensors 119a and 119b. The initial mode initiated at various times during the day and times of the month may be stored in a look up table in central unit 109 and/or master circuit 103a or in each circuit 103. As a result of the baseline noise voltage or current measured in step 305 a noise voltage or current threshold 309 may be set in step 307. Threshold 309 may be an adaptive or a constant value which may be measured in frequency range between 10 kilo-Hertz (kHz) to 400 kHz. Once the threshold 309 value has been set for system 10, normal operation of system 10 is initiated in step 311. If the threshold value 309 is exceeded for a predefined time, indicating potential arcing, a panel 101 may be disconnected (step 205) from a string 107 using switch SW1 in the circuit 103 associated with the panel 101. Otherwise normal operation of system 10 continues in step 311.

Figure 2A:
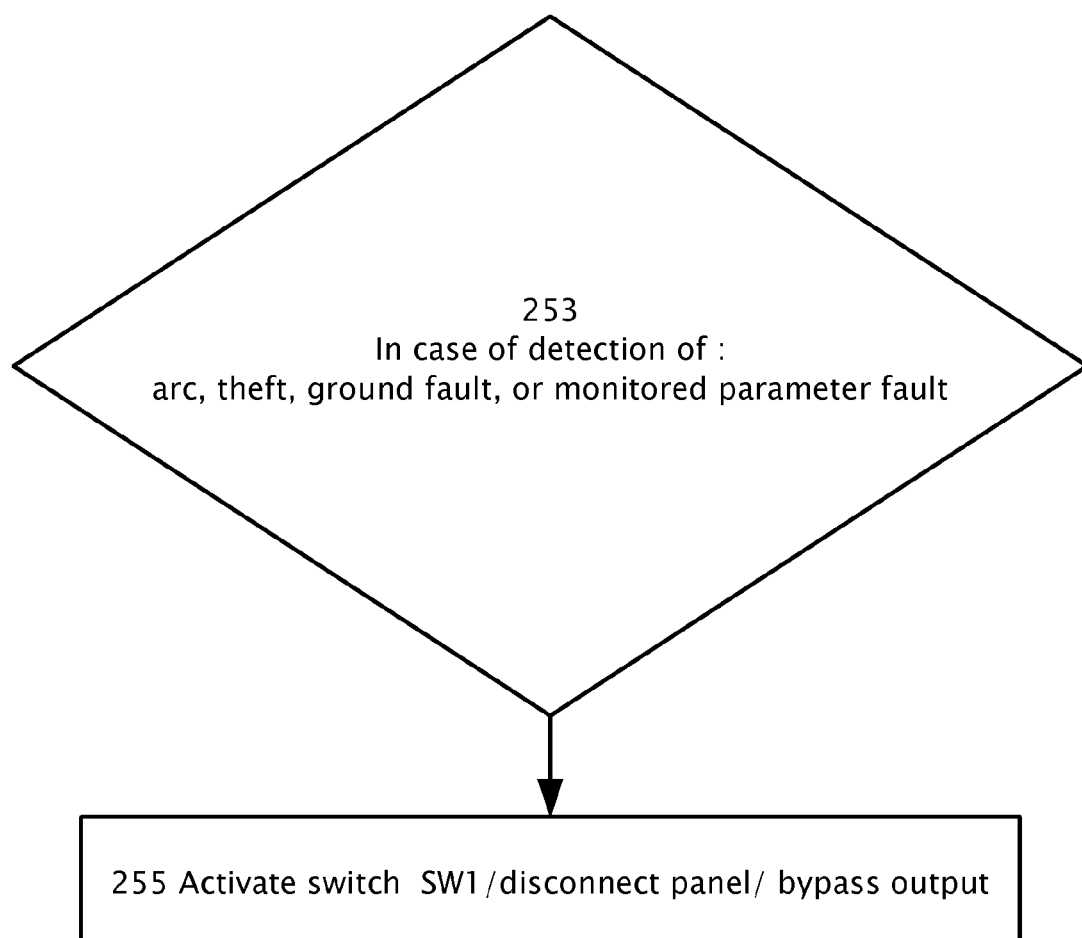
FIG. 2a shows a method which may be implemented in the circuit of FIG. 1b.

Reference is now made to FIG. 2a which shows a method 251 applicable to system 122 shown in FIG. 1g. In decision 253 a number of malfunctions may be detected which including arc detection 162, theft detection 164, ground fault detection 166, or a monitored parameter fault detection. It is possible in decision 253 to have various combinations of detection together; for example, arc detection 162 along with theft detection 164 or arc detection 162 with theft detection 164 and ground fault detection 166. A detection of a malfunction may cause switch SW1 to open to disconnect panel 101 from string 107 and the output terminals of circuit 103 output may be autonomously bypassed by bypass circuit 121 (step 255).

Figure 2B:
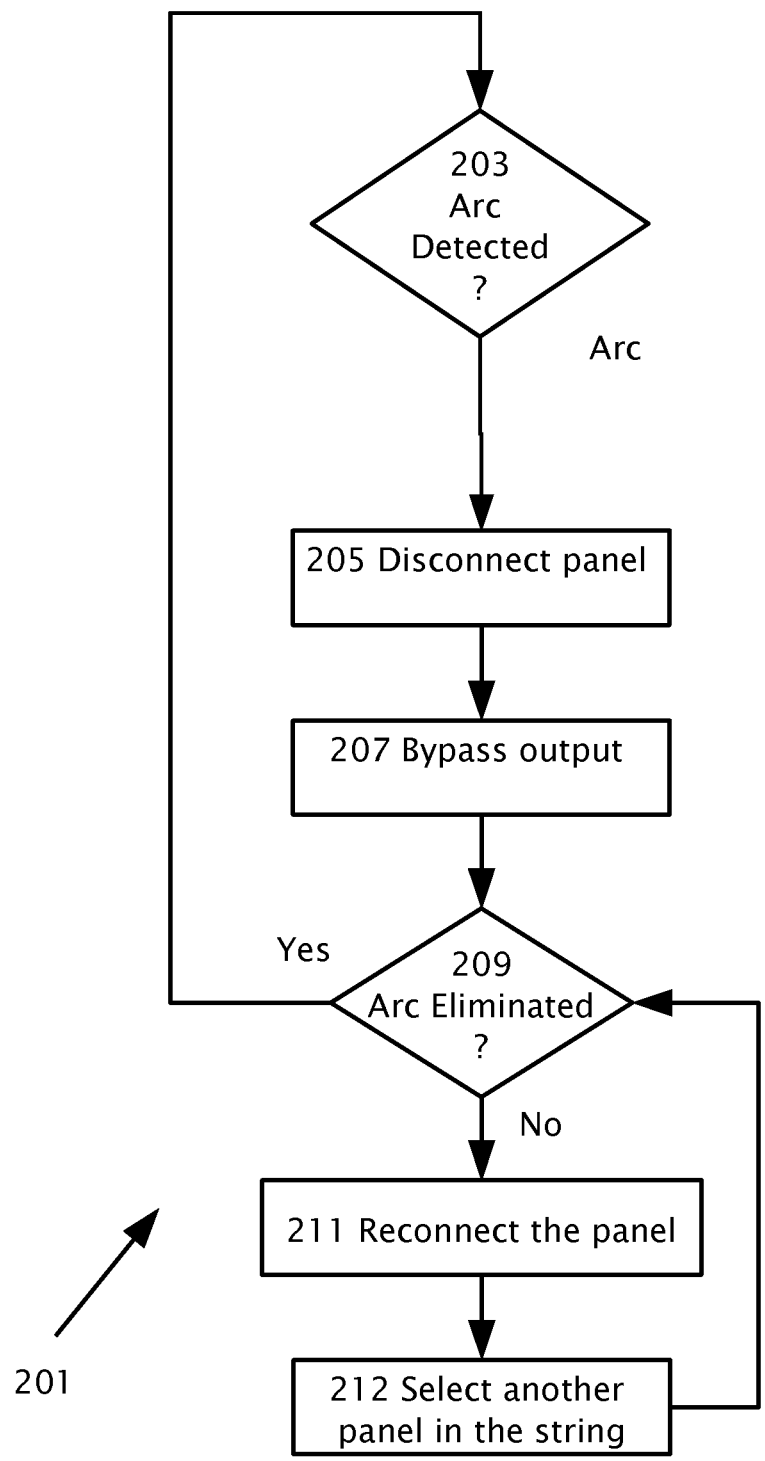
FIG. 2b shows an exemplary method for a circuit which considers the use of an arc detection module with a theft detection module.

Reference is made to FIG. 2b which shows an exemplary method 201 for circuit 103. In decision 203, if arcing is detected in the vicinity of a panel 101, panel 101 may be disconnected from a string 107 by opening switch SW1 in circuit 103. Panel 101 may be then bypassed using bypass 121. In decision 209, methods for arc detection may be applied to verify if arcing has been eliminated by bypassing circuit 103. If in decision block 209, arcing has not been eliminated, panel 101 may be re-connected in step 211 and another panel 101 may be selected in the string 107 and disconnected from string 107. Testing for arc elimination continues in decision 209. In decision 209 it may well be that if an arc is not eliminated, a whole string 107 may be disconnected by opening switches SW1 in string 107 and another string 107 may be checked to see if arcing may be taking place there instead.

A similar method to that shown in method 201 may also be applied to ground fault detection 166.

The indefinite articles "a", "an" is used herein, such as "a switch", "a module" have the meaning of "one or more" that is "one or more switches" or "one or more modules".

Although selected features of the present invention have been shown and described, it is to be understood the present invention is not limited to the described features. Instead, it is to be appreciated that changes may be made to these features without departing from the principles and spirit of the invention, the scope of which is defined by the claims and the equivalents thereof.

The invention claimed is:

1. An apparatus comprising:
    first and second nodes, a storage circuit, and a bypass circuit, wherein the apparatus is configured to:
    during a first phase of an operating period, store in the storage circuit operating power received across the first and the second nodes and isolate by the bypass circuit the first node from the second node; and
    during a second phase of the operating period, operate the bypass circuit using the power from the storage circuit, wherein the bypass circuit shorts the first node and the second node until the power stored in the storage circuit is expended.

2. The apparatus of claim 1, wherein the apparatus is configured to repeat cyclically the first and the second phases in response to a positive voltage from the first node to the second node.

3. The apparatus of claim 2, wherein, the bypass circuit is configured to isolate the first node from the second node in response to a negative voltage across the first node to the second node.

4. The apparatus of claim 2, wherein the second phase of the operating period is greater in duration than the first phase.

5. The apparatus of claim 1, comprising one or more photovoltaic cells connected across the first and the second nodes in parallel with the bypass circuit.

6. The apparatus of claim 5, further comprising one or more additional photovoltaic cells connected in series with the bypass circuit and in series with the one or more photovoltaic cells.

7. The apparatus of claim 5, further comprising a switch connected in series with the one or more photovoltaic cells between the first or the second node.

8. The apparatus of claim 1, wherein the storage circuit comprises a battery.

9. The apparatus of claim 1, wherein the storage circuit comprises a voltage regulator in parallel with a capacitor.

10. The apparatus of claim 1, wherein the storage circuit comprises a transient voltage suppression (TVS) diode.

11. A circuit comprising:
    first and second nodes;
    a controller circuit;
    a first switch comprising a first gate, a first drain, and a first source;
    a second switch comprising a second gate, a second drain, and a second source;
    a first diode comprising a first anode and a first cathode;
    a second diode comprising a second anode and a second cathode;
    a third diode comprising a third anode and a third cathode;
    a capacitor comprising a first terminal and a second terminal; and
    a voltage regulator comprising a positive terminal and a negative terminal, wherein the first terminal and the third cathode are connected, wherein the first node, the first drain, the first cathode, the third anode, and the positive terminal are connected, wherein the second node, the second drain, and the second cathode are connected, wherein the first source, the second source, the first anode, the second anode, the second terminal, and the negative terminal are connected, and wherein the controller circuit is powered from charge stored in the capacitor and configured to control the first gate and the second gate to open and close the first switch and second switch.

12. The circuit of claim 11, wherein the controller circuit is configured to open the first switch and the second switch in response to a negative voltage from the first node to the second node.

13. The circuit of claim 11, wherein the controller circuit is configured to close the first switch and the second switch in response to a positive voltage from the first node to the second node.

14. A method comprising:
charging a storage circuit with power received across first and second nodes over a first duration when the first node is isolated from the second node by a bypass circuit;
providing the power from the storage circuit to the bypass circuit over a second duration; and
shorting the first node to the second node through the bypass circuit over the second duration in response to the bypass circuit receiving the power provided from the storage circuit.

15. The method of claim 14, wherein the providing of the power from the storage circuit to the bypass circuit is responsive to a negative differential in a voltage of the first node to a voltage of the second node.

16. The method of claim 15, further comprising:
responsive to a positive differential in the voltage of the first node to the voltage of the second node, re-isolating the first node and the second node and discontinuing the providing of the power from the storage circuit to the bypass circuit.

17. The method of claim 15, wherein the negative differential in the voltage of the first node to the second node results from a shading of a photovoltaic panel connected across the first node and the second node.

18. The method of claim 14, wherein shorting the first node and the second node comprises closing a first switch and a second switch connected in series across the first node and the second node.

19. The method of claim 14, wherein providing power from the storage circuit to the bypass circuit is responsive to a condition selected from the group consisting of: an arc, a ground fault, and a monitored parameter fault.

20. The method of claim 14, wherein the storage circuit comprises a voltage regulator in parallel with a capacitor.

* * * * *